United States Patent
Kim

(10) Patent No.: US 7,668,038 B2
(45) Date of Patent: Feb. 23, 2010

(54) SEMICONDUCTOR MEMORY DEVICE INCLUDING A WRITE RECOVERY TIME CONTROL CIRCUIT

(75) Inventor: Kyoung-Ho Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 258 days.

(21) Appl. No.: 11/984,761

(22) Filed: Nov. 21, 2007

(65) Prior Publication Data
US 2008/0123452 A1 May 29, 2008

(30) Foreign Application Priority Data
Nov. 24, 2006 (KR) ...................... 10-2006-0116743

(51) Int. Cl.
*G11C 8/18* (2006.01)
(52) U.S. Cl. ........................... 365/233.16; 365/233.12; 365/230.03; 365/230.08; 365/203; 365/194
(58) Field of Classification Search ............ 365/233.12, 365/233.13, 233.16, 233.18, 230.03, 230.08, 365/203, 194
See application file for complete search history.

(56) References Cited

U.S. PATENT DOCUMENTS
6,185,141 B1   2/2001   Hoshita et al.
6,643,218 B1 * 11/2003   Chun .................... 365/233.12
2008/0123452 A1 * 5/2008   Kim ........................... 365/203

FOREIGN PATENT DOCUMENTS
KR   1998-30793       7/1998
KR   10-2003-0009072  1/2003

* cited by examiner

*Primary Examiner*—Andrew Q Tran
(74) *Attorney, Agent, or Firm*—Harness, Dickey & Pierce, P.L.C.

(57) ABSTRACT

A semiconductor memory device may include a clock buffer, a command decoder and a write recovery time control circuit. The clock buffer may generate an internal clock signal based on an external clock signal. The command decoder may generate a write command signal by decoding an external command signal. The write recovery time control circuit may gate a plurality of bank pre-charge control signals in a wave pipeline mode based on the internal clock signal, the write command signal and a write recovery time control signal having a plurality of bits to generate a plurality of gated bank pre-charge control signals. Therefore, the semiconductor memory device may decrease a number of flip-flops required to control a write recovery time.

25 Claims, 15 Drawing Sheets

SEMICONDUCTOR MEMORY DEVICE INCLUDING A WRITE RECOVERY TIME CONTROL CIRCUIT

PRIORITY STATEMENT

This application claims priority under 35 USC § 119 to Korean Patent Application No. 2006-116743 filed on Nov. 24, 2006 in the Korean Intellectual Property Office (KIPO), the entire contents of which are incorporated herein by reference.

BACKGROUND

1. Field

The example embodiments relate to a semiconductor memory device, and more particularly to a semiconductor memory device including a write recovery time control circuit and a method of controlling a write recovery time of the semiconductor memory device.

2. Description

A synchronous semiconductor memory device may input and output data in synchronization with an external clock. Due to an increased operation speed of a Dynamic Random Access Memory (DRAM), a word line (WL) may be disabled by a pre-charge command before data is sufficiently written into a memory cell in response to a write command. A column selecting line (CSL) enable signal and a pre-charge command may be generated after a write command is generated, and the time period between the generation of the CSL enable signal. The generation of the pre-charge command may be referred to as a write recovery time (tWR).

A semiconductor memory device capable of controlling a write recovery time may help to ensure proper operation of a synchronous semiconductor memory device.

SUMMARY

Accordingly, the example embodiments provided may substantially address one or more of the problems that exist due to limitations and disadvantages of the conventional art.

At least one example embodiment provides a semiconductor memory device including a write recovery time control circuit that may be capable of disabling a word line after data is sufficiently written into a memory cell in a write mode.

At least one example embodiment provides a method of controlling a write recovery time of a semiconductor memory device that may be capable of disabling a word line after data is sufficiently written into a memory cell in a write mode.

According to at least one example embodiment, a semiconductor memory device may include a clock buffer, a command decoder and a write recovery time control circuit. The clock buffer may generate an internal clock signal based on an external clock signal. The command decoder may generate a write command signal by decoding an external command signal. The write recovery time control circuit may gate a plurality of bank pre-charge control signals in a wave pipeline mode based on the internal clock signal. The write command signal and a write recovery time control signal may have a plurality of bits to generate a plurality of gated bank pre-charge control signals.

According to at least one example embodiment, the write recovery time control circuit may include a master circuit and a plurality of slave circuits. The master circuit may generate a first gate control signal which may have a plurality of bits and a second gate control signal which may have a plurality of bits based on the internal clock signal, the write command signal and the write recovery time control signal. The slave circuits may gate each of the bank pre-charge control signals in a wave pipeline mode in response to the first gate control signal and the second gate control signal to generate the gated bank pre-charge control signals.

Each of the slave circuits may include a pre-charge control signal generation circuit which may perform an AND operation on a bank address signal and an auto pre-charge address signal to generate the bank pre-charge control signal.

According to at least one example embodiment, the master circuit may include a first delay circuit, a write recovery time counter, a second delay circuit and a third delay circuit. The first delay circuit may generate a first signal by delaying the write command signal by a first time. The write recovery time counter may generate a second signal by delaying the first signal by a second time in response to the internal clock signal and the write recovery time control signal. The second delay circuit may generate the first gate control signal in response to the first signal. The first gate control signal may have a phase difference that may correspond to a period of the first signal and may have a plurality of bits. The third delay circuit may generate the second gate control signal in response to the second signal. The second gate control signal may have a phase difference which may correspond to a period of the second signal and may have a plurality of bits.

The second time may be set based on enabled bits of the write recovery time control signal.

The write recovery time counter may include a plurality of flip-flops which may be operated in response to the write recovery time control signal.

According to at least one example embodiment, the second delay circuit may include a first flip-flop, a second flip-flop, a third flip-flop, a fourth flip-flop, a fifth flip-flop and a sixth flip-flop. The first flip-flop may latch a signal of an input terminal in response to the first signal to generate a first bit of the first gate control signal. The second flip-flop may latch the first bit of the first gate control signal in response to the first signal to generate a second bit of the first gate control signal. The third flip-flop may latch the second bit of the first gate control signal in response to the first signal to generate a third bit of the first gate control signal. The fourth flip-flop may latch the third bit of the first gate control signal in response to the first signal to generate a fourth bit of the first gate control signal. The fifth flip-flop may latch the fourth bit of the first gate control signal in response to the first signal to generate a fifth bit of the first gate control signal. The sixth flip-flop may latch the fifth bit of the first gate control signal in response to the first signal to generate a sixth bit of the first gate control signal. The input terminal of the first flip-flop may be electrically connected to an output terminal of the sixth flip-flop.

According to at least one example embodiment, the third delay circuit may include a first flip-flop, a second flip-flop, a third flip-flop, a fourth flip-flop, a fifth flip-flop and a sixth flip-flop. The first flip-flop may latch a signal of an input terminal in response to the second signal to generate a first bit of the second gate control signal. The second flip-flop may latch the first bit of the second gate control signal in response to the second signal to generate a second bit of the second gate control signal. The third flip-flop may latch the second bit of the second gate control signal in response to the second signal to generate a third bit of the second gate control signal. The fourth flip-flop may latch the third bit of the second gate control signal in response to the second signal to generate a fourth bit of the second gate control signal. The fifth flip-flop may latch the fourth bit of the second gate control signal in response to the second signal to generate a fifth bit of the second gate control signal. The sixth flip-flop may latch the fifth bit of the second gate control signal in response to the second signal to generate a sixth bit of the second gate control signal. The input terminal of the first flip-flop may be electrically connected to an output terminal of the sixth flip-flop.

According to at least one example embodiment, the master circuit may include a first delay circuit, a second delay circuit, a third delay circuit and a fourth delay circuit. The first delay circuit may generate a first signal by delaying the write command signal by a first time. The second delay circuit may generate a second signal by delaying the first signal by a second time. The third delay circuit may generate the first gate control signal in response to the first signal. The first gate control signal may have a phase difference that may correspond to a period of the first signal and may have a plurality of bits. The fourth delay circuit may generate the second gate control signal in response to the second signal. The second gate control signal may have a phase difference that may correspond to a period of the second signal and have a plurality of bits.

A number of the slave circuits may correspond to a number of memory banks.

Each of the slave circuits may include a first gating circuit and a second gating circuit. The first gating circuit may latch a first bank pre-charge control signal in response to the first gate control signal to generate a third signal. The second gating circuit may latch the third signal in response to the second gate control signal to generate a first gated bank pre-charge control signal.

According to at least one example embodiment, the first gating circuit may include a first flip-flop, a second flip-flop, a third flip-flop, a fourth flip-flop, a fifth flip-flop and a sixth flip-flop. The first flip-flop may latch the first bank pre-charge control signal in response to a first bit of the first gate control signal to generate a first bit of the third signal. The second flip-flop may latch the first bank pre-charge control signal in response to a second bit of the first gate control signal to generate a second bit of the third signal. The third flip-flop may latch the first bank pre-charge control signal in response to a third bit of the first gate control signal to generate a third bit of the third signal. The fourth flip-flop may latch the first bank pre-charge control signal in response to a fourth bit of the first gate control signal to generate a fourth bit of the third signal. The fifth flip-flop may latch the first bank pre-charge control signal in response to a fifth bit of the first gate control signal to generate a fifth bit of the third signal. The sixth flip-flop may latch the first bank pre-charge control signal in response to a sixth bit of the first gate control signal to generate a sixth bit of the third signal.

According to at least one example embodiment, the second gating circuit may include a first latch, a second latch, a third latch, a fourth latch, a fifth latch and a sixth latch. The first latch may latch the first bit of the third signal in response to a first bit of the second gate control signal to generate the first gated bank pre-charge control signal. The second latch may latch the second bit of the third signal in response to a second bit of the second gate control signal to generate the first gated bank pre-charge control signal. The third latch may latch the third bit of the third signal in response to a third bit of the second gate control signal to generate the first gated bank pre-charge control signal. The fourth latch may latch the fourth bit of the third signal in response to a fourth bit of the second gate control signal to generate the first gated bank pre-charge control signal. The fifth latch may latch the fifth bit of the third signal in response to a fifth bit of the second gate control signal to generate the first gated bank pre-charge control signal. The sixth latch may latch the sixth bit of the third signal in response to a sixth bit of the second gate control signal to generate the first gated bank pre-charge control signal.

According to at least one example embodiment, the write recovery time control circuit may further include a pre-charge control circuit configured to generate a plurality of pre-charge enable signals in response to the gated bank pre-charge control signals to provide the pre-charge enable signals to a row address buffer.

According to at least one example embodiment, the write recovery time control circuit may include a master circuit and a plurality of slave circuits. The master circuit may generate a first gate control signal, a second gate control signal having a plurality of bits, a third gate control signal having a plurality of bits and a fourth gate control signal. The slave circuits may gate each of the bank pre-charge control signals in a wave pipeline mode in response to the first gate control signal, the second gate control signal, the third gate control signal and the fourth gate control signal to generate the gated bank pre-charge control signals.

According to at least one example embodiment, the master circuit may include a first delay circuit, a second delay circuit, a third delay circuit, a fourth delay circuit, a fifth delay circuit and a write recovery time counter. The first delay circuit may generate the first gate control signal by delaying the write command signal by a first time. The second delay circuit may generate a first signal by delaying the first gate control signal by a second time. The third delay circuit may generate the second gate control signal in response to the first signal. The second gate control signal may have a phase difference that may correspond to a period of the first signal and may have a plurality of bits. The fourth delay circuit may generate a second signal by delaying the first signal by a third time. The fifth delay circuit may generate the third gate control signal in response to the second signal. The third gate control signal may have a phase difference that may correspond to a period of the second signal and may have a plurality of bits. The write recovery time counter may generate the fourth gate control signal by delaying the second signal by a fourth time in response to the internal clock signal and the write recovery time control signal.

According to at least one example embodiment, the first delay circuit may generate the first gate control signal by delaying the write command signal by two cycles of the internal clock signal.

The fourth time may be set based on enabled bits of the write recovery time control signal.

According to at least one example embodiment, the third delay circuit may include a first flip-flop, a second flip-flop, a third flip-flop, a fourth flip-flop, a fifth flip-flop and a sixth flip-flop.

According to at least one example embodiment, the first flip-flop may latch a signal of an input terminal in response to the first signal to generate a first bit of the second gate control signal. The second flip-flop may latch the first bit of the second gate control signal in response to the first signal to generate a second bit of the second gate control signal. The third flip-flop may latch the second bit of the second gate control signal in response to the first signal to generate a third bit of the second gate control signal. The fourth flip-flop may latch the third bit of the second gate control signal in response to the first signal to generate a fourth bit of the second gate control signal. The fifth flip-flop may latch the fourth bit of the second gate control signal in response to the first signal to generate a fifth bit of the second gate control signal. The sixth flip-flop may latch the fifth bit of the second gate control signal in response to the first signal to generate a sixth bit of the second gate control signal. The input terminal of the first flip-flop may be electrically connected to an output terminal of the sixth flip-flop.

According to at least one example embodiment, the fifth delay circuit may include a first flip-flop, a second flip-flop, a third flip-flop, a fourth flip-flop, a fifth flip-flop and a sixth flip-flop. The first flip-flop may latch a signal of an input terminal in response to the second signal to generate a first bit of the third gate control signal. The second flip-flop may latch the first bit of the third gate control signal in response to the second signal to generate a second bit of the third gate control signal. The third flip-flop may latch the second bit of the third gate control signal in response to the second signal to generate a third bit of the third gate control signal. The fourth flip-flop may latch the third bit of the third gate control signal in response to the second signal to generate a fourth bit of the third gate control signal. The fifth flip-flop may latch the fourth bit of the third gate control signal in response to the second signal to generate a fifth bit of the third gate control signal. The sixth flip-flop may latch the fifth bit of the third gate control signal in response to the second signal to generate a sixth bit of the third gate control signal. The input terminal of the first flip-flop may be electrically connected to an output terminal of the sixth flip-flop.

A number of the slave circuits may correspond to a number of memory banks.

Each of the slave circuits may include a first gating circuit, a second gating circuit, a third gating circuit and a fourth gating circuit. The first gating circuit may latch a first bank pre-charge control signal in response to the first gate control signal to generate a third signal. The second gating circuit may latch the third signal in response to the second gate control signal to generate a fourth signal having a plurality of bits. The third gating circuit may latch the fourth signal in response to the third gate control signal to generate a fifth signal. The fourth gating circuit may latch the fifth signal in response to the fourth gate control signal to generate a first gated bank pre-charge control signal.

According to at least one example embodiment, the first gating circuit may include a flip-flop configured to latch the first bank pre-charge control signal in response to a first bit of the first gate control signal to generate the third signal.

According to at least one example embodiment, the second gating circuit may include a first flip-flop, a second flip-flop, a third flip-flop, a fourth flip-flop, a fifth flip-flop and a sixth flip-flop. The first flip-flop may latch the third signal in response to a first bit of the second gate control signal to generate a first bit of the fourth signal. The second flip-flop may latch the third signal in response to a second bit of the second gate control signal to generate a second bit of the fourth signal. The third flip-flop may latch the third signal in response to a third bit of the second gate control signal to generate a third bit of the fourth signal. The fourth flip-flop may latch the third signal in response to a fourth bit of the second gate control signal to generate a fourth bit of the fourth signal. The fifth flip-flop may latch the third signal in response to a fifth bit of the second gate control signal to generate a fifth bit of the fourth signal. The sixth flip-flop may latch the third signal in response to a sixth bit of the second gate control signal to generate a sixth bit of the fourth signal.

According to at least one example embodiment, the third gating circuit may include a first flip-flop, a second flip-flop, a third flip-flop, a fourth flip-flop, a fifth flip-flop and a sixth flip-flop. The first flip-flop may latch a first bit of the fourth signal in response to a first bit of the third gate control signal to generate the fifth signal. The second flip-flop may latch a second bit of the fourth signal in response to a second bit of the third gate control signal to generate the fifth signal. The third flip-flop may latch a third bit of the fourth signal in response to a third bit of the third gate control signal to generate the fifth signal. The fourth flip-flop may latch a fourth bit of the fourth signal in response to a fourth bit of the third gate control signal to generate the fifth signal. The fifth flip-flop may latch a fifth bit of the fourth signal in response to a fifth bit of the third gate control signal to generate the fifth signal. The sixth flip-flop may latch a sixth bit of the fourth signal in response to a sixth bit of the third gate control signal to generate the fifth signal.

According to at least one example embodiment, the fourth gating circuit may include a flip-flop configured to latch the fifth signal in response to the fourth gate control signal to generate the first gated bank pre-charge control signal.

According to at least one example embodiment, the semiconductor memory device may further include an input latency control circuit which may be configured to gate an address signal in a wave pipe line mode to generate a column address signal and a bank address signal based on the internal clock signal, the write command signal and a write latency signal.

In a method of controlling a write recovery time of a semiconductor memory device according to at least one example embodiment, a first gate control signal which may have a plurality of bits and a second gate control signal which may have a plurality of bits may be generated, based on an internal clock signal, a write command signal and a write recovery time control signal. A plurality of bank pre-charge control signals may be gated in a wave pipeline mode in response to the first gate control signal and the second gate control signal to generate a plurality of gated bank pre-charge control signals.

In a method of controlling a write recovery time of a semiconductor memory device according to at least one example embodiment, a first gate control signal, a second gate control signal which may have a plurality of bits, a third gate control signal which may have a plurality of bits and a fourth gate control signal may be generated in response to an internal clock signal, a write command signal and a write recovery time control signal. A plurality of bank pre-charge control signals may be gated in a wave pipeline mode in response to the first gate control signal, the second gate control signal, the third gate control signal and the fourth gate control signal to generate a plurality of gated bank pre-charge control signals.

Therefore, the semiconductor memory device including the write recovery time control circuit may decrease the number of flip-flops required to control a write recovery time.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
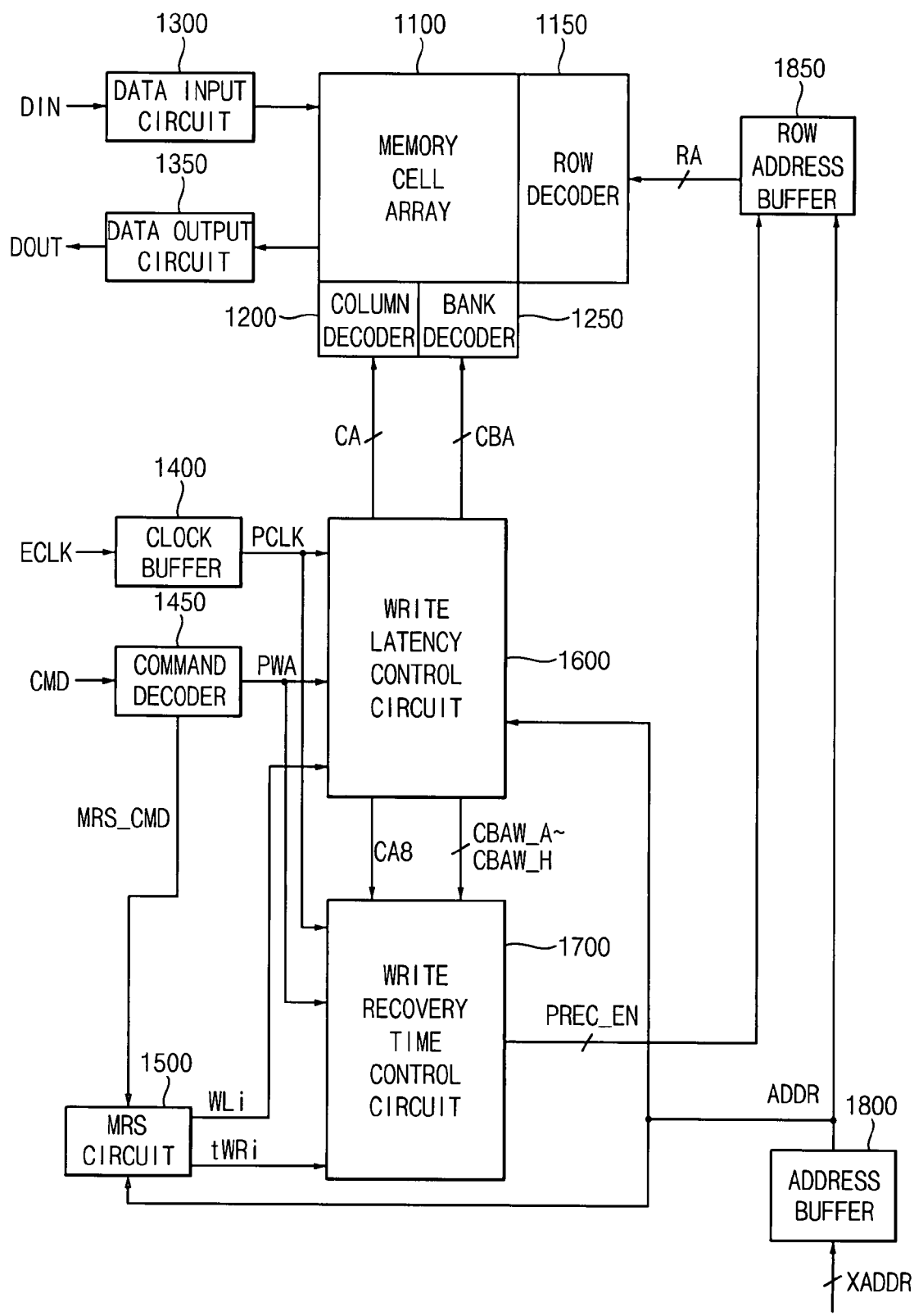
FIG. 1 is a block diagram illustrating a semiconductor memory device according to at least one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor memory device according to at least one example embodiment.

Referring to FIG. 1, a semiconductor memory device 1000 may include a memory cell array 1100, an address buffer 1800, a row address buffer 1850, a row decoder 1150, a column decoder 1200, a bank decoder 1250, a data input circuit 1300, a data output circuit 1350, a clock buffer 1400, a command decoder 1450, a Mode Register Set (MRS) circuit 1500, a write latency control circuit 1600 and a write recovery time control circuit 1700.

The memory cell array 1100 may be a data storage space where a lot of memory cells may be arranged in a matrix configuration. The data input circuit 1300 may buffer an input data DIN and may write the buffered input data to the memory cell array 1100. The data output circuit 1350 may buffer data read from the memory cell array 1100 and may output the buffered data as an output data DOUT. The address buffer 1800 may receive an external address signal XADDR, may buffer the external address signal XADDR and may generate an internal address signal ADDR. The row address buffer 1850 may buffer the internal address signal ADDR in response to a pre-charge enable signal PREC_EN and may generate a buffered row address signal RA. The row decoder 1150 may decode the buffered row address signal RA. The column decoder 1200 may receive a column address signal CA from the write latency control circuit 1600, may decode the column address signal CA and may generate a decoded column address signal. The bank decoder 1250 may receive a bank address signal CBA from the write latency control circuit 1600, may decode the bank address signal CBA and may generate a decoded bank address signal for selecting a memory bank.

The clock buffer 1400 may receive an external clock signal ECLK, may buffer the external clock signal ECLK and may generate an internal clock signal PCLK. The command decoder 1450 may receive a command signal CMD such as /WE, /CS, /RAS and /CAS etc., from an external device, may decode the command signal CMD and may output a decoded command signal (for example, PWA). The MRS circuit 1500 may set a mode set register (MSR) in response to the internal address signal ADDR and a MRS command MRS_CMD for designating an operation mode. A write latency signal WLi and a write recovery time control signal tWRi may be set in response to MRS command MRS_CMD and may be stored in the mode set register included in the MRS circuit 1500.

The write latency control circuit 1600 may gate the internal address signal ADDR in a wave pipeline mode based on the internal clock signal PCLK, the write command signal PWA and the write latency signal WLi, and may generate the column address signal CA and the bank address signal CBA. The write latency control circuit 1600 may generate bank address signals CBAW_A through CBAW_H and an auto pre-charge address signal CA8.

The write recovery time control circuit 1700 may gate bank pre-charge control signals PWAPT_A through PWAPT_H in a wave pipeline mode based on the internal clock signal PCLK, the write command signal PWA and a write recovery time control signal tWRi. The write recovery time control circuit 1700 may generate a plurality of bank pre-charge control signals that may be gated, and may generate the pre-charge enable signal PREC_EN which may correspond to the bank pre-charge control signals PWAPT_A through PWAPT_H. The bank pre-charge control signals PWAPT_A through PWAPT_H may be generated based on the bank address signals CBAW_A through CBAW_H and the auto pre-charge address signal CA8 as will be described with reference to FIG. 8.

Figure 2:
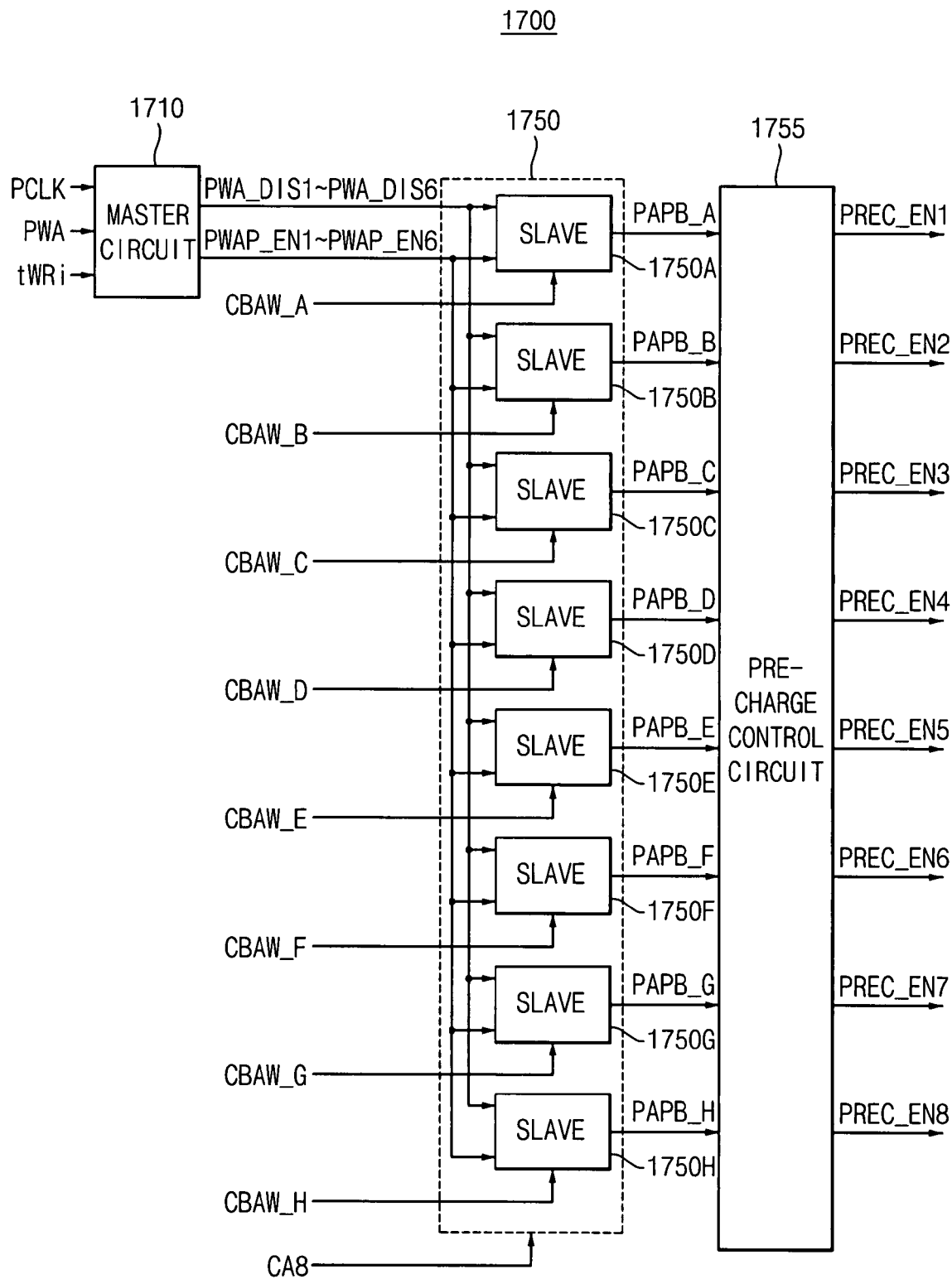
FIG. 2 is a block diagram illustrating a write recovery time control circuit in the semiconductor memory device of FIG. 1 according to at least one example embodiment.

FIG. 2 is a block diagram illustrating a write recovery time control circuit in the semiconductor memory device of FIG. 1 according to at least one example embodiment. The write recovery time control circuit 1700 as illustrated in FIG. 2 may be included in the semiconductor memory device formed with eight memory banks A, B, C, D, E, F, G and H.

Referring to FIG. 2, the write recovery time control circuit 1700 may include a master circuit 1710, a slave circuit 1750 and a pre-charge control circuit 1755.

The master circuit 1710 may generate a first gate control signal which may have bits PWA_DIS1 through PWA_DIS6 and a second gate control signal which may have bits PWAP_EN1 through PWAP_EN6, based on the internal clock signal PCLK, the write command signal PWA and the write recovery time control signal tWRi.

The slave circuit 1750 may gate the bank pre-charge control signals PWAPT_A through PWAPT_H in a wave pipeline mode in response to the first gate control signal PWA_DIS1 through PWA_DIS6 and the second gate control signal PWAP_EN1 through PWAP_EN6, and may generate a plurality of gated bank pre-charge control signals PAPB_A through PAPB_H.

Figure 8:
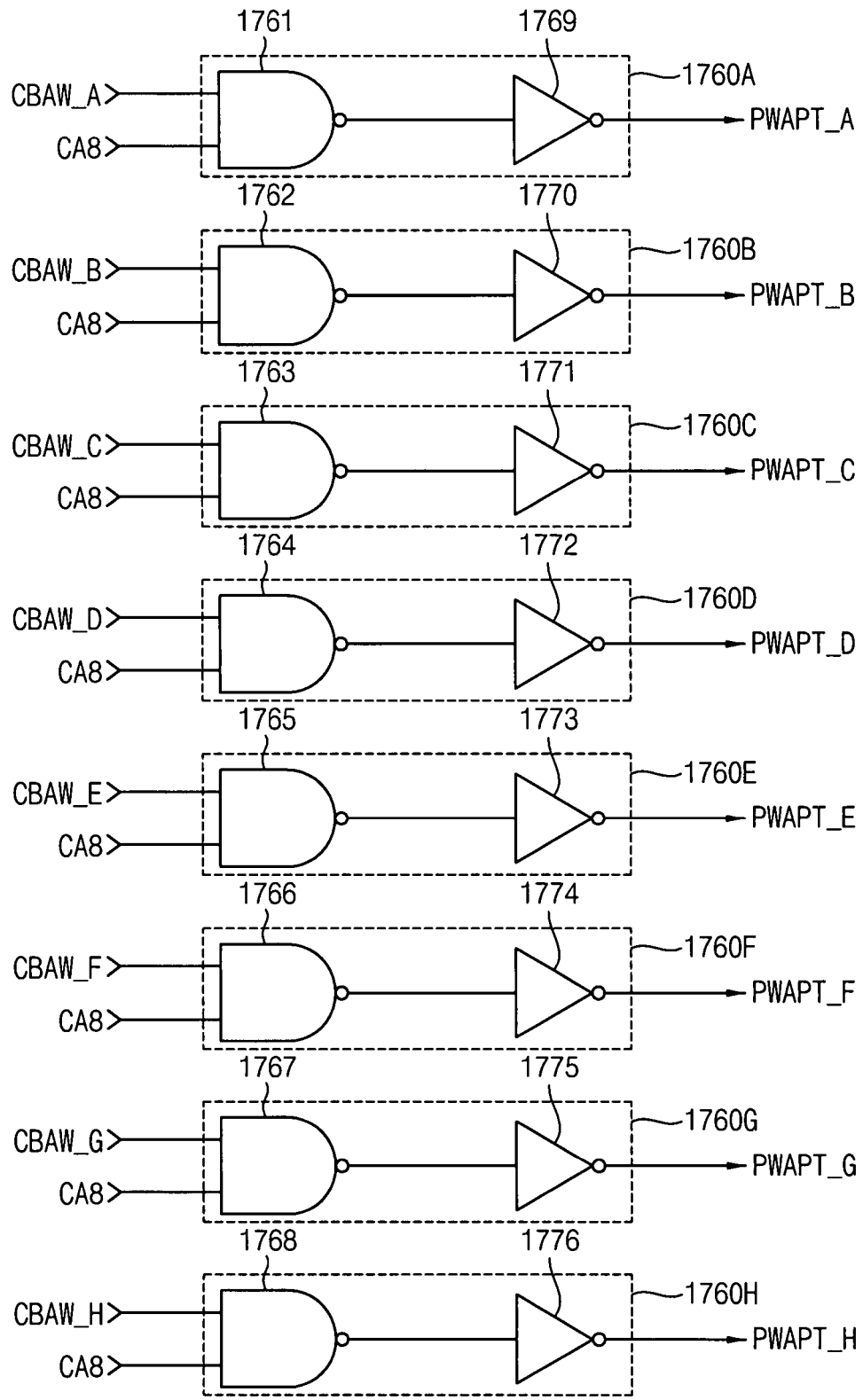
FIG. 8 is a circuit diagram illustrating a pre-charge control signal generation circuit in the slave circuit of FIG. 2 according to at least one example embodiment.

As illustrated in FIG. 8, a pre-charge control signal generation circuit 1760 may perform an AND operation on the bank address signals CBAW_A through CBAW_H and the auto pre-charge address signal CA8, and may generate the bank pre-charge control signals PWAPT_A through PWAPT_H.

The slave circuit 1750 may include a first slave unit 1750A, a second slave unit 1750B, a third slave unit 1750C, a fourth slave unit 1750D, a fifth slave unit 1750E, a sixth slave unit 1750F, a seventh slave unit 1750G and a eighth slave unit 1750H.

Referring to FIGS. 2 and 8, the first slave unit 1750A may gates a bank pre-charge control signal PWAPT_A for a bank A in a wave pipeline mode in response to the first gate control signal PWA_DIS1 through PWA_DIS6 and the second gate control signal PWAP_EN1 through PWAP_EN6, and may generates a gated bank pre-charge control signal PAPB_A for the bank A. The second slave unit 1750B may gate a bank pre-charge control signal PWAPT_B for a bank B in a wave pipeline mode in response to the first gate control signal PWA_DIS1 through PWA_DIS6 and the second gate control signal PWAP_EN1 through PWAP_EN6, and may generate a gated bank pre-charge control signal PAPB_B for the bank B. The third slave unit 1750C may gate a bank pre-charge control signal PWAPT_C for a bank C in a wave pipeline mode in response to the first gate control signal PWA_DIS1 through PWA_DIS6 and the second gate control signal PWAP_EN1 through PWAP_EN6, and may generate a gated bank pre-charge control signal PAPB_C for the bank C. The fourth slave unit 1750D may gate a bank pre-charge control signal PWAPT_D for a bank D in a wave pipeline mode in response to the first gate control signal PWA_DIS1 through PWA_DIS6 and the second gate control signal PWAP_EN1 through PWAP_EN6, and may generate a gated bank pre-charge control signal PAPB_D for the bank D. The fifth slave unit 1750E may gate a bank pre-charge control signal PWAPT_E for a bank E in a wave pipeline mode in response to the first gate control signal PWA_DIS1 through PWA_ DIS6 and the second gate control signal PWAP_EN1 through PWAP_EN6, and may generate a gated bank pre-charge control signal PAPB_E for the bank E. The sixth slave unit 1750F may gate a bank pre-charge control signal PWAPT_F for a bank F in a wave pipeline mode in response to the first gate control signal PWA_DIS1 through PWA_ DIS6 and the second gate control signal PWAP_EN1 through PWAP_EN6, and may generate a gated bank pre-charge control signal PAPB_F for the bank F. The seventh slave unit 1750G may gate a bank pre-charge control signal PWAPT_G for a bank G in a wave pipeline mode in response to the first gate control signal PWA_DIS1 through PWA_ DIS6 and the second gate control signal PWAP_EN1 through PWAP_EN6, and may generate a gated bank pre-charge control signal PAPB_G for the bank G. The eighth slave unit 1750H may gate a bank pre-charge control signal PWAPT_H for a bank H in a wave pipeline mode in response to the first gate control signal PWA_DIS1 through PWA_ DIS6 and the second gate control signal PWAP_EN1 through PWAP_EN6, and may generate a gated bank pre-charge control signal PAPB_H for the bank H.

The pre-charge control circuit 1755 may include a plurality of pre-charge control units (not shown) which may operate for the memory banks A through H, respectively; may generate pre-charge enable signals PREC_EN1 through PREC_EN6 in response to the gated bank pre-charge control signals PAPB_A, PAPB_B, PAPB_C, PAPB_D, PAPB_E, PAPB_F, PAPB_G and PAPB_H; and may provide the pre-charge enable signals PREC_EN1 through PREC_EN6 to the row address buffer 1850 in FIG. 1.

The write recovery time control circuit 1700 may control a generation time point of the gated bank pre-charge control signals PAPB_A, PAPB_B, PAPB_C, PAPB_D, PAPB_E, PAPB_F, PAPB_G and PAPB_H in response to the write recovery time control signal tWRi (i is a natural number). That is, the write recovery time control circuit 1700 may control an activation time point of gated bank pre-charge control signals PAPB_A, PAPB_B, PAPB_C, PAPB_D, PAPB_E, PAPB_F, PAPB_G and PAPB_H for pre-charging the memory banks A through H by delaying the bank pre-charge control signals PWAPT_A through PWAPT_H, with reference to the activation time point of the write command signal PWA, by clock cycles, where the clock cycles may be determined based on the write recovery time control signal tWRi.

Figure 3:
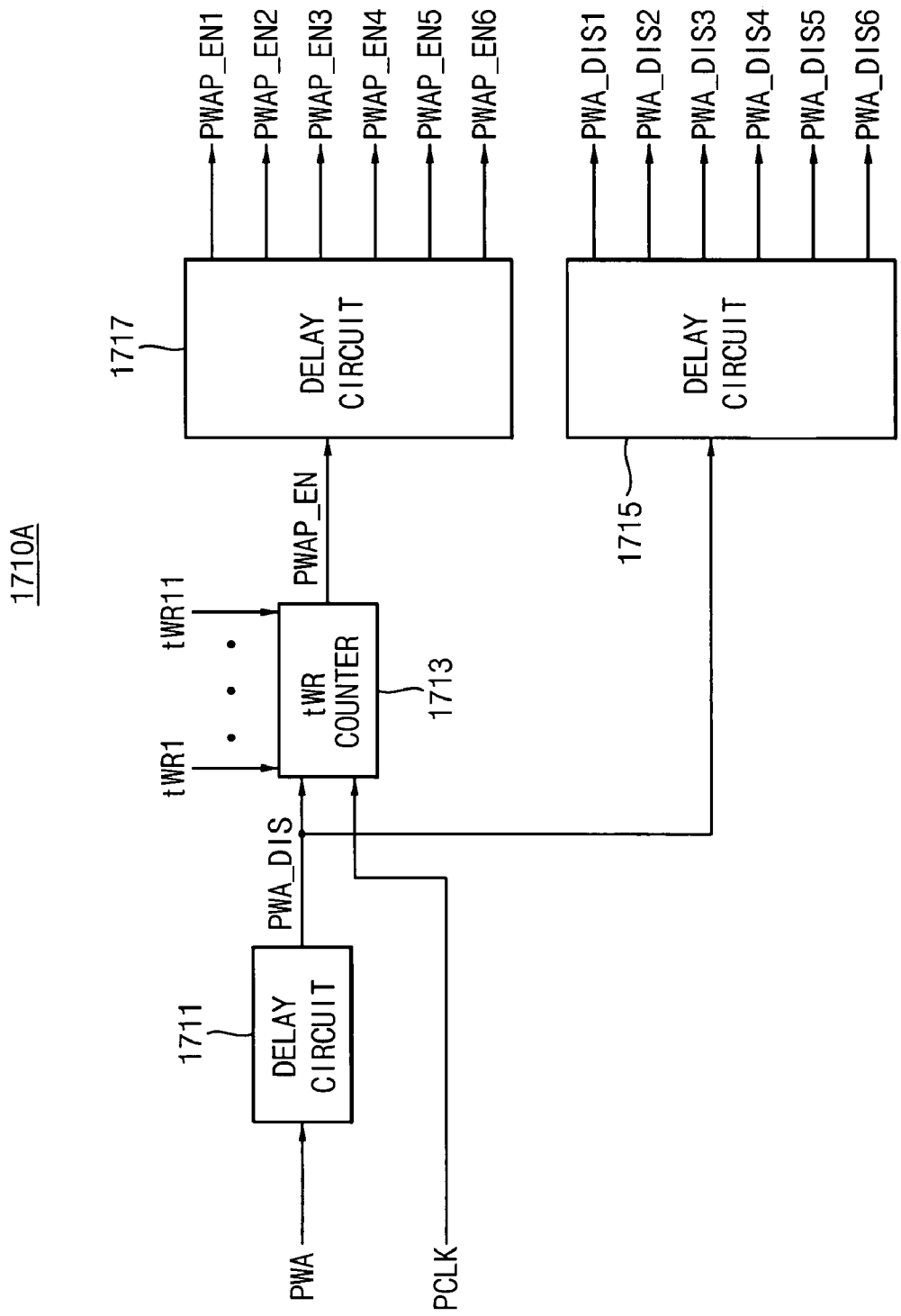
FIG. 3 is a block diagram an example of a master circuit in the write recovery time control circuit of FIG. 2 according to at least one example embodiment.

FIG. 3 is a block diagram of a master circuit in the write recovery time control circuit of FIG. 2 according to at least one example embodiment.

Referring to FIG. 3, the master circuit 1710A may include a first delay circuit 1711, a write recovery time counter 1713, a second delay circuit 1715 and a third delay circuit 1717.

The first delay circuit 1711 may generate a first signal PWA_DIS by delaying the write command signal PWA by a first time. The write recovery time counter 1713 may generate a second signal PWAP_EN by delaying the first signal PWA_DIS by a second time in response to the internal clock signal PCLK and a write recovery time control signal tWR1 through tWR11. The second delay circuit 1715 may generate the first gate control signal PWA_DIS1 through PWA_DIS6 in response to the first signal PWA_DIS. The first gate control signals PWA_DIS1 through PWA_DIS6 may have a phase difference which may correspond to a period of the first signal PWA_DIS and may have a plurality of bits. The third delay circuit 1717 may generate the second gate control signal PWAP_EN1 through PWAP_EN6 in response to the second signal PWAP_EN. The second gate control signal PWAP_EN1 through PWAP_EN6 may have a phase difference corresponding to a period of the second signal PWAP_EN and may have a plurality of bits.

Figure 4:
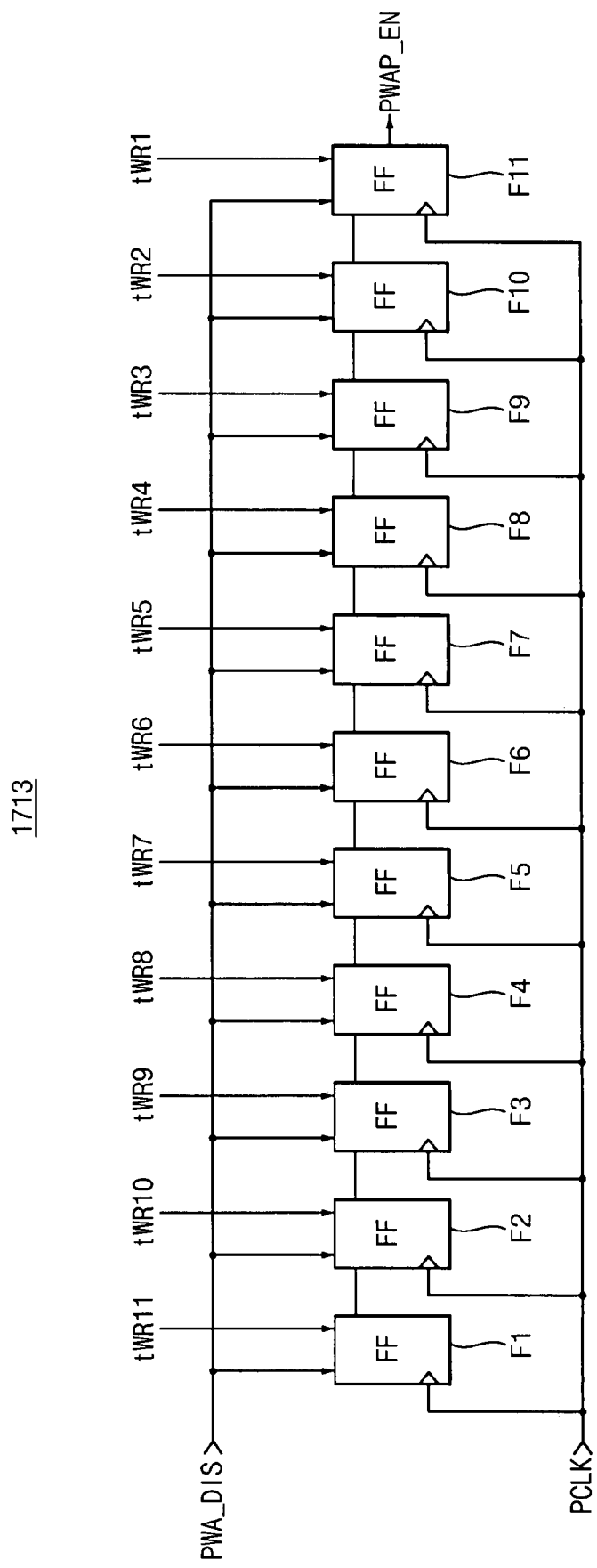
FIG. 4 is a circuit diagram illustrating a write recovery time counter in the master circuit of FIG. 3 according to at least one example embodiment.

FIG. 4 is a circuit diagram illustrating a write recovery time counter in the master circuit of FIG. 3 according to at least one example embodiment. The write recovery time counter 1713 may include flip-flops F1 through F11 which may be operated in response to the write recovery time control signal tWR1 through tWR11. Each of the flip-flops F1 through F11 may be a D flip-flop.

Referring to FIG. 4, a first flip-flop F1 may latch the first signal PWA_DIS in response to the internal clock signal PCLK. A second flip-flop F2 may latch one of the first signal PWA_DIS and an output signal of the first flip-flop F1 in response to the internal clock signal PCLK. A third flip-flop F3 may latch one of the first signal PWA_DIS and an output signal of the second flip-flop F2 in response to the internal clock signal PCLK. A fourth flip-flop F4 may latch one of the first signal PWA_DIS and an output signal of the third flip-flop F3 in response to the internal clock signal PCLK. A fifth flip-flop F5 may latch one of the first signal PWA_DIS and an output signal of the fourth flip-flop F4 in response to the internal clock signal PCLK. A sixth flip-flop F6 may latch one of the first signal PWA_DIS and an output signal of the fifth flip-flop F5 in response to the internal clock signal PCLK. A seventh flip-flop F7 may latch one of the first signal PWA_DIS and an output signal of the sixth flip-flop F6 in response to the internal clock signal PCLK. An eighth flip-flop F8 may latch one of the first signal PWA_DIS and an output signal of the seventh flip-flop F7 in response to the internal clock signal PCLK. A ninth flip-flop F9 may latch one of the first signal PWA_DIS and an output signal of the eighth flip-flop F8 in response to the internal clock signal PCLK. A tenth flip-flop F10 may latch one of the first signal PWA_DIS and an output signal of the ninth flip-flop F9 in response to the internal clock signal PCLK. An eleventh flip-flop F11 may latch one of the first signal PWA_DIS and an output signal of the tenth flip-flop F10 in response to the internal clock signal PCLK. An output signal of the eleventh flip-flop F11 may be the second signal PWAP_EN.

Hereinafter, an operation of the write recovery time counter 1713 is described.

The number of flip-flops included in the write recovery time counter 1713 may be determined according to a maximum value of a write recovery time. That is, when the maximum value of the write recovery time is M (M is a natural number), M numbers of flip-flops may be included in the write recovery time counter 1713. In FIG. 4, the maximum value of the write recovery time is 11 tCK, where 1 tCK is one clock cycle (one period) of the internal clock signal PCLK.

When the write recovery time is 11 tCK, the first signal PWA_DIS may be inputted to an input terminal of the first flip-flop F1 and the first signal PWA_DIS may be sequentially passed from the first flip-flop F1 to the eleventh flip-flop F1. Therefore, the output signal PWAP_EN of the write recovery time counter 1713 may be delayed by 11 tCK in comparison with the first signal PWA_DIS.

When the write recovery time is 6 tCK, the first signal PWA_DIS may be inputted to an input terminal of the sixth flip-flop F6 and the first signal PWA_DIS may be sequentially passed from the sixth flip-flop F6 to the eleventh flip-flop F1. Therefore, the output signal PWAP_EN of the write recovery time counter 1713 may be delayed by 6 tCK in comparison with the first signal PWA_DIS.

Figure 5:
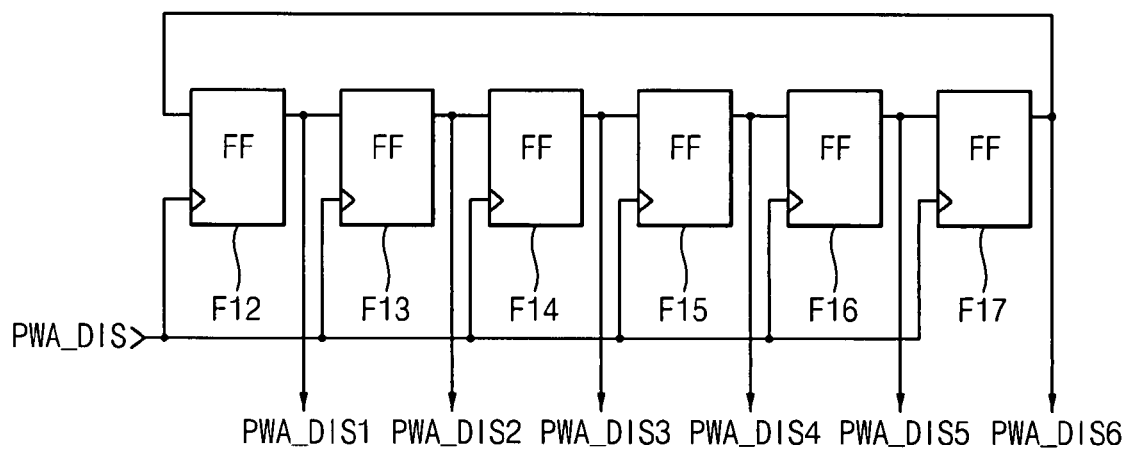
FIG. 5 is a circuit diagram illustrating a second delay circuit in the master circuit of FIG. 3 according to at least one example embodiment.

FIG. 5 is a circuit diagram illustrating a second delay circuit in the master circuit of FIG. 3 according to at least one example embodiment.

Referring to FIG. 5, the second delay circuit 1715 may include a first flip-flop F12, a second flip-flop F13, a third flip-flop F14, a fourth flip-flop F15, a fifth flip-flop F16 and a sixth flip-flop F17.

The first flip-flop F12 may latch a signal of an input terminal in response to the first signal PWA_DIS and may generate a first bit PWA_DIS1 of the first gate control signal. The second flip-flop F13 may latch the first bit PWA_DIS1 of the first gate control signal in response to the first signal PWA_DIS and may generate a second bit PWA_DIS2 of the first gate control signal. The third flip-flop F14 may latch the second bit PWA_DIS2 of the first gate control signal in response to the first signal PWA_DIS and may generate a third bit PWA_DIS3 of the first gate control signal. The fourth flip-flop F15 may latch the third bit PWA_DIS3 of the first gate control signal in response to the first signal PWA_DIS and may generate a fourth bit PWA_DIS4 of the first gate control signal. The fifth flip-flop F16 may latch the fourth bit PWA_DIS4 of the first gate control signal in response to the first signal PWA_DIS and may generate a fifth bit PWA_DIS5 of the first gate control signal. The sixth flip-flop F17 may latch the fifth bit PWA_DIS5 of the first gate control signal in response to the first signal PWA_DIS and may generate a sixth bit PWA_DIS6 of the first gate control signal. The input terminal of the first flip-flop F12 may be electrically connected to an output terminal of the sixth flip-flop F17.

Figure 6:
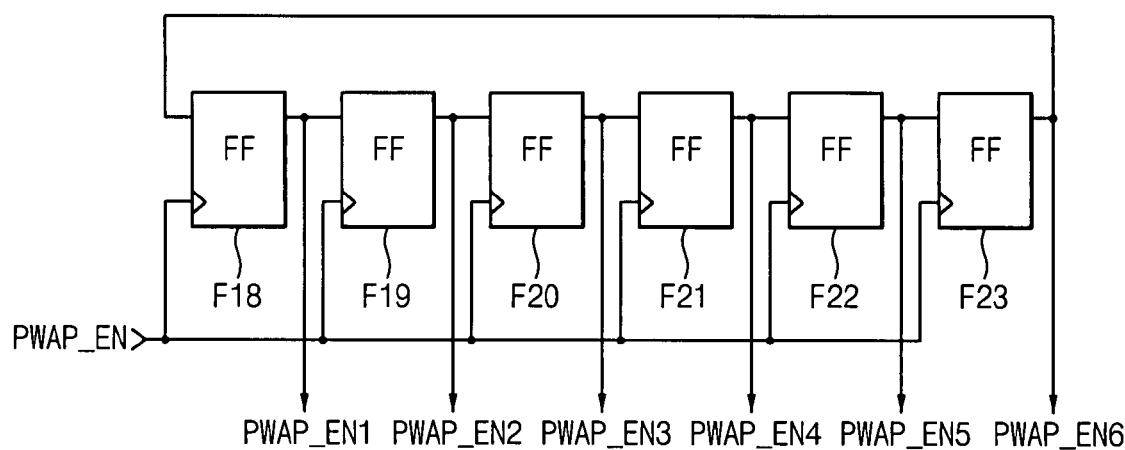
FIG. 6 is a circuit diagram illustrating a third delay circuit in the master circuit of FIG. 3 according to at least one example embodiment.

FIG. 6 is a circuit diagram illustrating a third delay circuit in the master circuit of FIG. 3 according to at least one example embodiment.

Referring to FIG. 6, the third delay circuit 1717 may include a first flip-flop F18, a second flip-flop F19, a third flip-flop F20, a fourth flip-flop F21, a fifth flip-flop F22 and a sixth flip-flop F23.

The first flip-flop F18 may latch a signal of an input terminal in response to the second signal PWAP_EN and may generate a first bit PWAP_EN1 of the second gate control signal. The second flip-flop F19 may latch the first bit PWAP_EN1 of the second gate control signal in response to the second signal PWAP_EN and may generate a second bit PWAP_EN2 of the second gate control signal. The third flip-flop F20 may latch the second bit PWAP_EN2 of the second gate control signal in response to the second signal PWAP_EN and may generate a third bit PWAP_EN3 of the second gate control signal. The fourth flip-flop F21 may latch the third bit PWAP_EN3 of the second gate control signal in response to the second signal PWAP_EN and may generate a fourth bit PWAP_EN4 of the second gate control signal. The fifth flip-flop F22 may latch the fourth bit PWAP_EN4 of the second gate control signal in response to the second signal PWAP_EN and may generate a fifth bit PWAP_EN5 of the second gate control signal. The sixth flip-flop F23 may latch the fifth bit PWAP_EN5 of the second gate control signal in response to the second signal PWAP_EN and may generate a sixth bit PWAP_EN6 of the second gate control signal. The input terminal of the first flip-flop F18 may be electrically connected to an output terminal of the sixth flip-flop F23.

Figure 7:
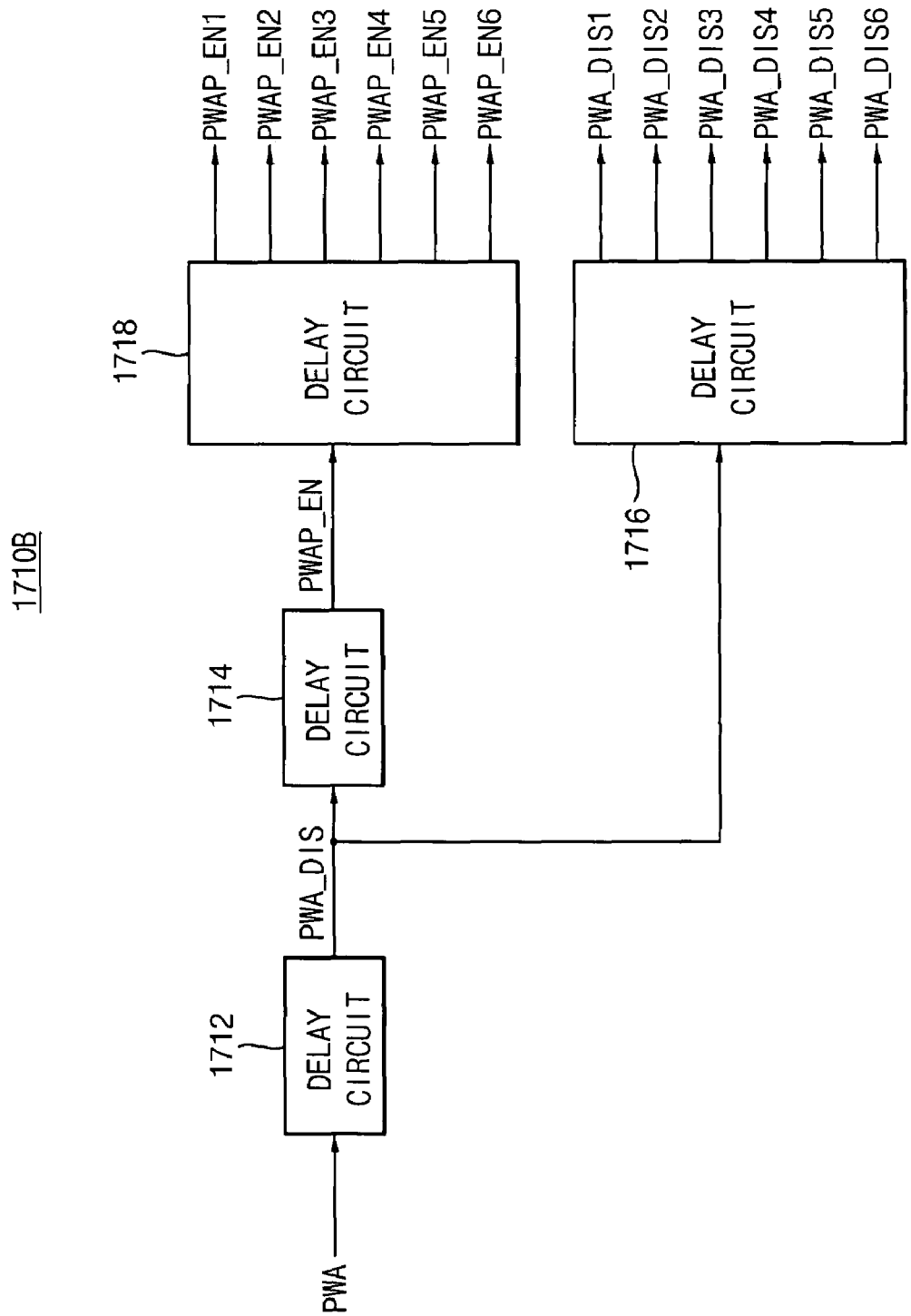
FIG. 7 is a block diagram illustrating a master circuit in the write recovery time control circuit of FIG. 2 according to at least one example embodiment.

FIG. 7 is a block diagram illustrating a master circuit in the write recovery time control circuit of FIG. 2 according to at least one example embodiment.

Referring to FIG. 7, the master circuit 1710B may include a fourth delay circuit 1712, a fifth delay circuit 1714, a sixth delay circuit 1716 and a seventh delay circuit 1718.

The fourth delay circuit 1712 may generate a first signal PWA_DIS by delaying the write command signal PWA by a first time. The fifth delay circuit 1714 may generate a second signal PWAP_EN by delaying the first signal PWA_DIS by a second time. The sixth delay circuit 1716 may generate the first gate control signal PWA_DIS1 through PWA_DIS6 in response to the first signal PWA_DIS. The first gate control signals PWA_DIS1 through PWA_DIS6 may have a phase difference which may correspond to a period of the first signal PWA_DIS and may have a plurality of bits. The seventh delay circuit 1718 may generate the second gate control signal PWAP_EN1 through PWAP_EN6 in response to the second signal PWAP_EN. The second gate control signal PWAP_EN1 through PWAP_EN6 may have a phase difference which may correspond to a period of the second signal PWAP_EN and may have a plurality of bits.

The master circuit 1710B of FIG. 7 may include the fifth delay circuit 1714 instead of the write recovery time counter 1713 which was illustrated as being included in the master circuit 1710A in FIG. 3. That is, the master circuit 1710B may not use the write recovery time control signal tWR1 through tWR11 and may generate the second signal PWAP_EN by delaying the first signal PWA_DIS using a delay circuit.

FIG. 8 is a circuit diagram illustrating a pre-charge control signal generation circuit in the slave circuit of FIG. 2 according to at least one example embodiment.

Referring to FIG. 8, the pre-charge control signal generation circuit 1760 may be included in the slave circuit 1750, and the pre-charge control signal generation circuit 1760 may generate the bank pre-charge control signals PWAPT_A through PWAPT_H for memory banks A through H, based on the bank address signals CBAW_A through CBAW_H and the auto pre-charge address signal CA8.

The pre-charge control signal generation circuit 1760 may include a first pre-charge control signal generation unit 1760A, a second pre-charge control signal generation unit 1760B, a third pre-charge control signal generation unit 1760C, a fourth pre-charge control signal generation unit 1760D, a fifth pre-charge control signal generation unit 1760E, a sixth pre-charge control signal generation unit 1760F, a seventh pre-charge control signal generation unit 1760G and a eighth pre-charge control signal generation unit 1760H.

The first pre-charge control signal generation unit 1760A may include a first NAND gate 1761 and a first inverter 1769. The first NAND gate 1761 may perform a NAND operation on a first bank address signal CBAW_A and the auto pre-charge address signal CA8. The first inverter 1769 may invert an output signal of the first NAND gate 1761. The second pre-charge control signal generation unit 1760B may include a second NAND gate 1762 and a second inverter 1770. The second NAND gate 1762 may perform a NAND operation on a second bank address signal CBAW_B and the auto pre-charge address signal CA8. The second inverter 1770 may invert an output signal of the second NAND gate 1762. The third pre-charge control signal generation unit 1760C may include a third NAND gate 1763 and a third inverter 1771. The third NAND gate 1763 may perform a NAND operation on a third bank address signal CBAW_C and the auto pre-charge address signal CA8. The third inverter 1771 may invert an output signal of the third NAND gate 1763. The fourth pre-charge control signal generation unit 1760D may include a fourth NAND gate 1764 and a fourth inverter 1772. The fourth NAND gate 1764 may perform a NAND operation on a fourth bank address signal CBAW_D and the auto pre-charge address signal CA8. The fourth inverter 1772 may invert an output signal of the fourth NAND gate 1764. The fifth pre-charge control signal generation unit 1760E may include a fifth NAND gate 1765 and a fifth inverter 1773. The fifth NAND gate 1765 may perform a NAND operation on a fifth bank address signal CBAW_E and the auto pre-charge address signal CA8. The fifth inverter 1773 may invert an output signal of the fifth NAND gate 1765. The sixth pre-charge control signal generation unit 1760F may include a sixth NAND gate 1766 and a sixth inverter 1774. The sixth NAND gate 1766 may perform a NAND operation on a sixth bank address signal CBAW_F and the auto pre-charge address signal CA8. The sixth inverter 1774 may invert an output signal of the sixth NAND gate 1766. The seventh pre-charge control signal generation unit 1760G may include a seventh NAND gate 1767 and a seventh inverter 1775. The seventh NAND gate 1767 may perform a NAND operation on a seventh bank address signal CBAW_G and the auto pre-charge address signal CA8. The seventh inverter 1775 may invert an output signal of the seventh NAND gate 1767. The eighth pre-charge control signal generation unit 1760H may include an eighth NAND gate 1768 and an eighth inverter 1776. The eighth NAND gate 1768 may perform a NAND operation on an eighth bank address signal CBAW_H and the auto pre-charge address signal CA8. The eighth inverter 1776 may invert an output signal of the eighth NAND gate 1768.

The bank address signals CBAW_A through CBAW_H may represent information about the memory banks A, B, C, D, E, F, G and H, which may form a memory cell array, and the auto pre-charge address signal CA8 may represent information about an auto pre-charge. Therefore, the bank pre-charge control signals PWAPT_A through PWAPT_H, which may be generated by performing a NAND operation on the bank address signals CBAW_A through CBAW_H and the auto pre-charge address signal CA8, may represent information about a memory bank that is pre-charged.

Figure 9:
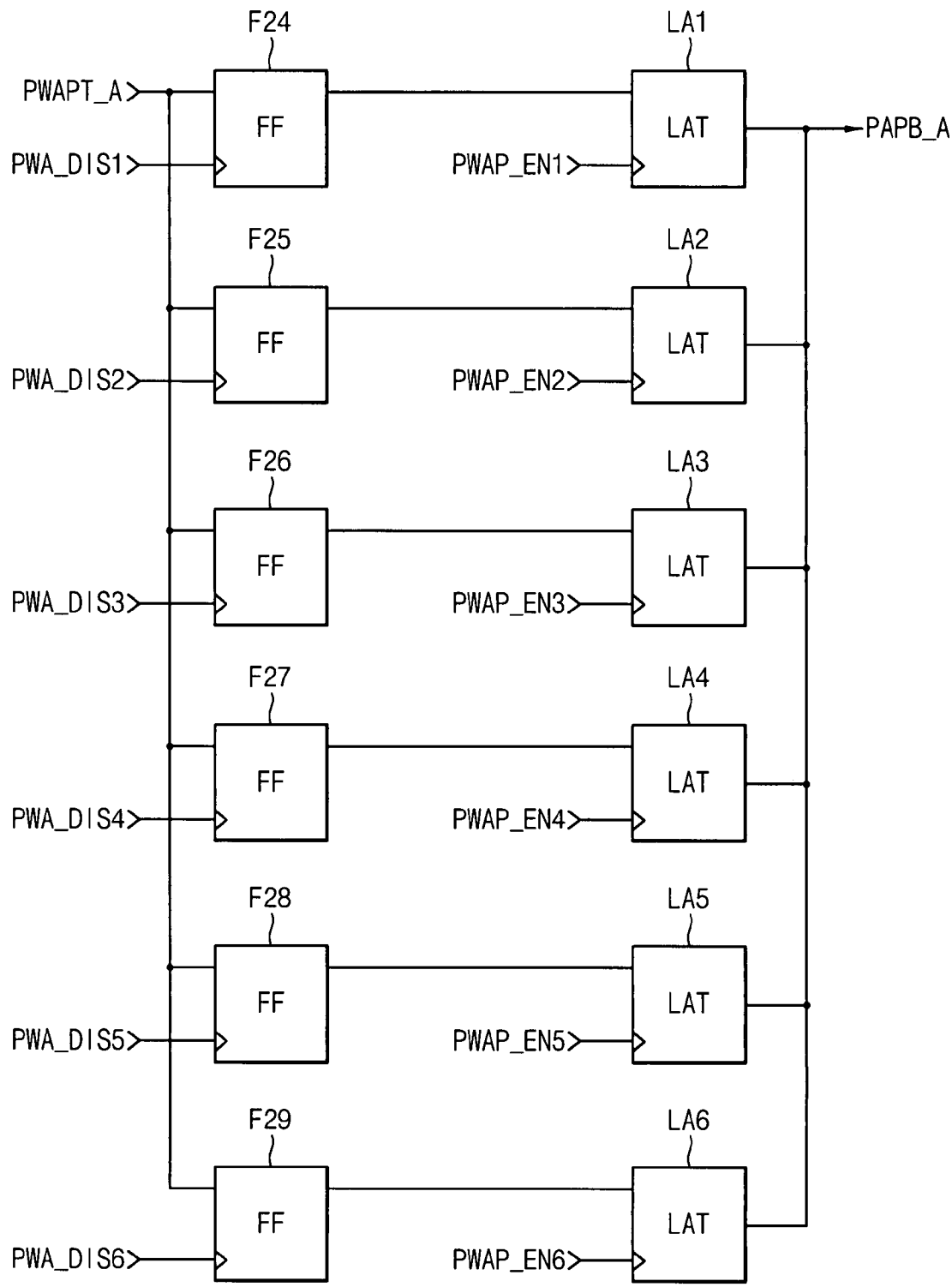
FIG. 9 is a circuit diagram illustrating a first slave unit in the slave circuit of FIG. 2 according to at least one example embodiment.
Figure 10:
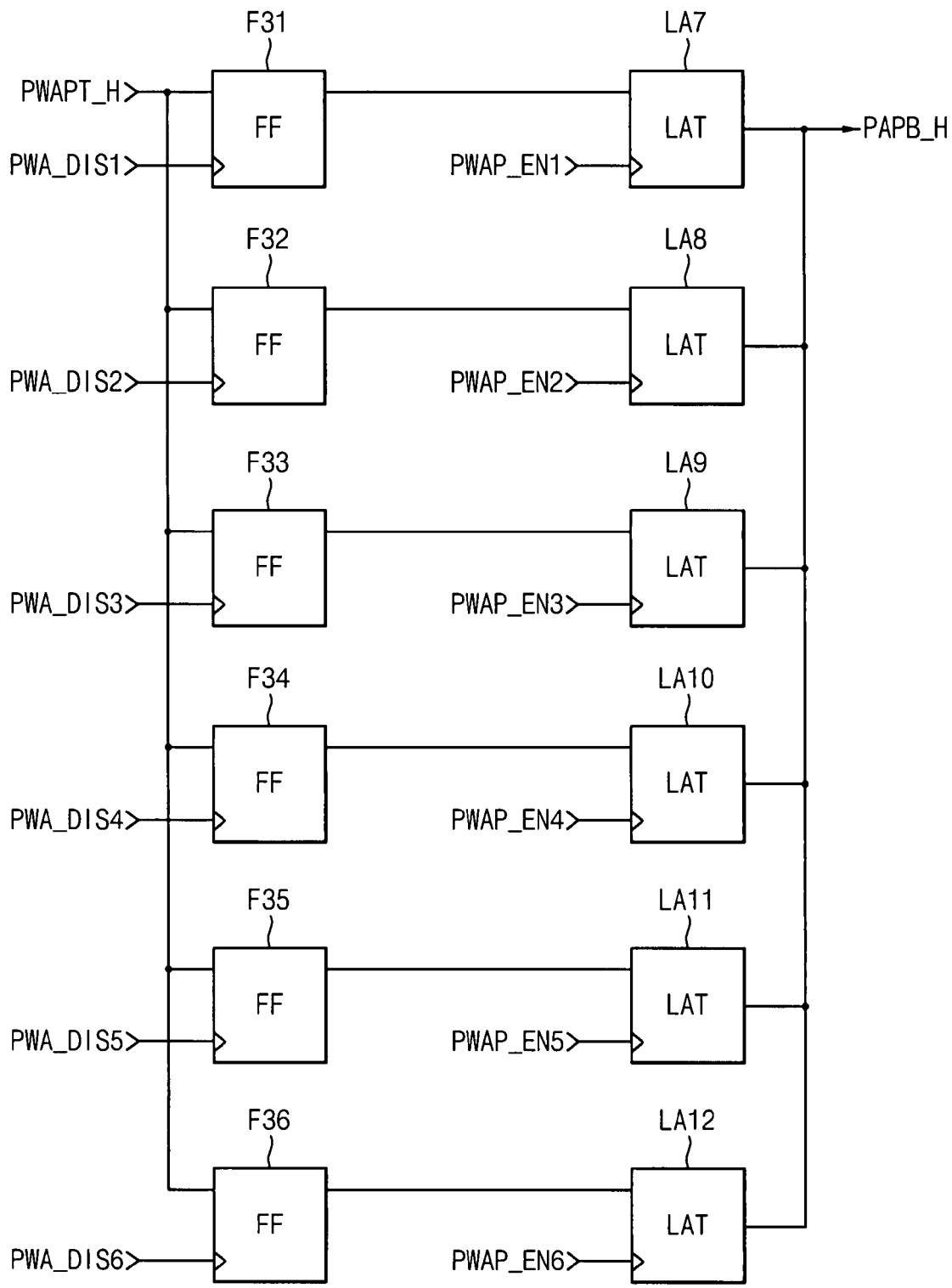
FIG. 10 is a circuit diagram illustrating an eighth slave unit in the slave circuit of FIG. 2 according to at least one example embodiment.

FIG. 9 is a circuit diagram illustrating a first slave unit in the slave circuit of FIG. 2 according to at least one example embodiment, and FIG. 10 is a circuit diagram illustrating an eighth slave unit in the slave circuit of FIG. 2 according to at least one example embodiment.

FIG. 9 illustrates the first slave unit 1750A generating a first gated bank pre-charge control signal PAPB_A for a bank A and FIG. 10 illustrates the eighth slave unit 1750H generating an eighth gated bank pre-charge control signal PAPB_H for a bank H.

Referring to FIG. 9, the first slave unit 1750A may include a first gating circuit and a second gating circuit. The first gating circuit may latch the first bank pre-charge control signal PWAPT_A in response to the first gate control signal PWA_DIS1 through PWA_DIS6 and may generate a third signal having a plurality of bits. The second gating circuit may latch each bit of the third signal and may generate the first gated bank pre-charge control signal PAPB_A.

The first gating circuit may include a first flip-flop F24, a second flip-flop F25, a third flip-flop F26, a fourth flip-flop F27, a fifth flip-flop F28 and a sixth flip-flop F29.

The first flip-flop F24 may latch the first bank pre-charge control signal PWAPT_A in response to the first bit PWA_DIS1 of the first gate control signal and may generate a first bit of the third signal. The second flip-flop F25 may latch the first bank pre-charge control signal PWAPT_A in response to the second bit PWA_DIS2 of the first gate control signal and may generate a second bit of the third signal. The third flip-flop F26 may latch the first bank pre-charge control signal PWAPT_A in response to the third bit PWA_DIS3 of the first gate control signal and may generate a third bit of the third signal. The fourth flip-flop F27 may latch the first bank pre-charge control signal PWAPT_A in response to the fourth bit PWA_DIS4 of the first gate control signal and may generate a fourth bit of the third signal. The fifth flip-flop F28 may latch the first bank pre-charge control signal PWAPT_A in response to the fifth bit PWA_DIS5 of the first gate control signal and may generate a fifth bit of the third signal. The sixth flip-flop F29 may latch the first bank pre-charge control signal PWAPT_A in response to the sixth bit PWA_DIS6 of the first gate control signal and may generate a sixth bit of the third signal.

The second gating circuit may include a first latch LA1, a second latch LA2, a third latch LA3, a fourth latch LA4, a fifth latch LA5 and a sixth latch LA6.

The first latch LA1 may latch the first bit of the third signal in response to the first bit PWAP_EN1 of the second gate control signal and may generate the first gated bank pre-charge control signal PAPB_A. The second latch LA2 may latch the second bit of the third signal in response to the second bit PWAP_EN2 of the second gate control signal and may generate the first gated bank pre-charge control signal PAPB_A. The third latch LA3 may latch the third bit of the third signal in response to the third bit PWAP_EN3 of the second gate control signal and may generate the first gated bank pre-charge control signal PAPB_A. The fourth latch LA4 may latch the fourth bit of the third signal in response to the fourth bit PWAP_EN4 of the second gate control signal and may generate the first gated bank pre-charge control signal PAPB_A. The fifth latch LA5 may latch the fifth bit of the third signal in response to the fifth bit PWAP_EN5 of the second gate control signal and may generate the first gated bank pre-charge control signal PAPB_A. The sixth latch LA6 may latch the sixth bit of the third signal in response to the sixth bit PWAP_EN6 of the second gate control signal and may generate the first gated bank pre-charge control signal PAPB_A. Output terminals of the latches LA1 through LA6 may be electrically connected to each other.

Referring to FIG. 10, the eighth slave unit 1750H may include a third gating circuit and a fourth gating circuit. The third gating circuit may latch an eighth bank pre-charge control signal PWAPT_H in response to the first gate control signal PWA_DIS1 through PWA_DIS6 and may generate the third signal having a plurality of bits. The fourth gating circuit may latch each bit of the third signal in response to the second gate control signal PWAP_EN1 through PWAP_EN6 and may generate an eighth gated bank pre-charge control signal PAPB_H.

The third gating circuit may include a seventh flip-flop F31, an eighth flip-flop F32, a ninth flip-flop F33, a tenth flip-flop F34, an eleventh flip-flop F35 and a twelfth flip-flop F36.

The seventh flip-flop F31 may latch the eighth bank pre-charge control signal PWAPT_H in response to the first bit PWA_DIS1 of the first gate control signal and may generate a first bit of the third signal. The eighth flip-flop F32 may latch the eighth bank pre-charge control signal PWAPT_H in response to the second bit PWA_DIS2 of the first gate control signal and may generate a second bit of the third signal. The ninth flip-flop F33 may latch the eighth bank pre-charge control signal PWAPT_H in response to the third bit PWA_DIS3 of the first gate control signal and may generate a third bit of the third signal. The tenth flip-flop F34 may latch the eighth bank pre-charge control signal PWAPT_H in response to the fourth bit PWA_DIS4 of the first gate control signal and may generate a fourth bit of the third signal. The eleventh flip-flop F35 may latch the eighth bank pre-charge control signal PWAPT_H in response to the fifth bit PWA_DIS5 of the first gate control signal and may generate a fifth bit of the third signal. The twelfth flip-flop F36 may latch the eighth bank pre-charge control signal PWAPT_H in response to the sixth bit PWA_DIS6 of the first gate control signal and may generate a sixth bit of the third signal.

The fourth gating circuit may include a seventh latch LA7, an eighth latch LA8, a ninth latch LA9, a tenth latch LA10, an eleventh latch LA11 and a twelfth latch L12.

The seventh latch LA7 may latch the first bit of the third signal in response to the first bit PWAP_EN1 of the second gate control signal and may generate the eighth gated bank pre-charge control signal PAPB_H. The eighth latch LA8 may latch the second bit of the third signal in response to the second bit PWAP_EN2 of the second gate control signal and may generate the eighth gated bank pre-charge control signal PAPB_H. The ninth latch LA9 may latch the third bit of the third signal in response to the third bit PWAP_EN3 of the second gate control signal and may generate the eighth gated bank pre-charge control signal PAPB_H. The tenth latch LA10 may latch the fourth bit of the third signal in response to the fourth bit PWAP_EN4 of the second gate control signal and may generate the eighth gated bank pre-charge control signal PAPB_H. The eleventh latch LA11 may latch the fifth bit of the third signal in response to the fifth bit PWAP_EN5 of the second gate control signal and may generate the eighth gated bank pre-charge control signal PAPB_H. The twelfth latch LA12 may latch the sixth bit of the third signal in response to the sixth bit PWAP_EN6 of the second gate control signal and may generate the eighth gated bank pre-charge control signal PAPB_H. Output terminals of the latches LA7 through LA12 may be electrically connected to each other.

As such, the second slave unit 1750B, the third slave unit 1750C, the fourth slave unit 1750D, the fifth slave unit 1750E, the sixth slave unit 1750F and the seventh slave unit 1750G may be equally implemented as the first slave unit 1750A of FIG. 9.

The write recovery time control circuit 1700 described with reference to FIG. 2 through FIG. 10 may gate the bank pre-charge control signals PWAPT_A through PWAPT_H in a wave pipeline mode, based on the internal clock signal PCLK, the write command signal PWA and the write recovery time control signal tWRi; may generate the gated bank pre-charge control signals; and may generate the pre-charge enable signal PREC_EN which may correspond to the bank pre-charge control signals PWAPT_A through PWAPT_H. Therefore, a semiconductor memory device including a write recovery time control circuit according to the present invention may decrease a number of flip-flops required to control a write recovery time.

Figure 11:
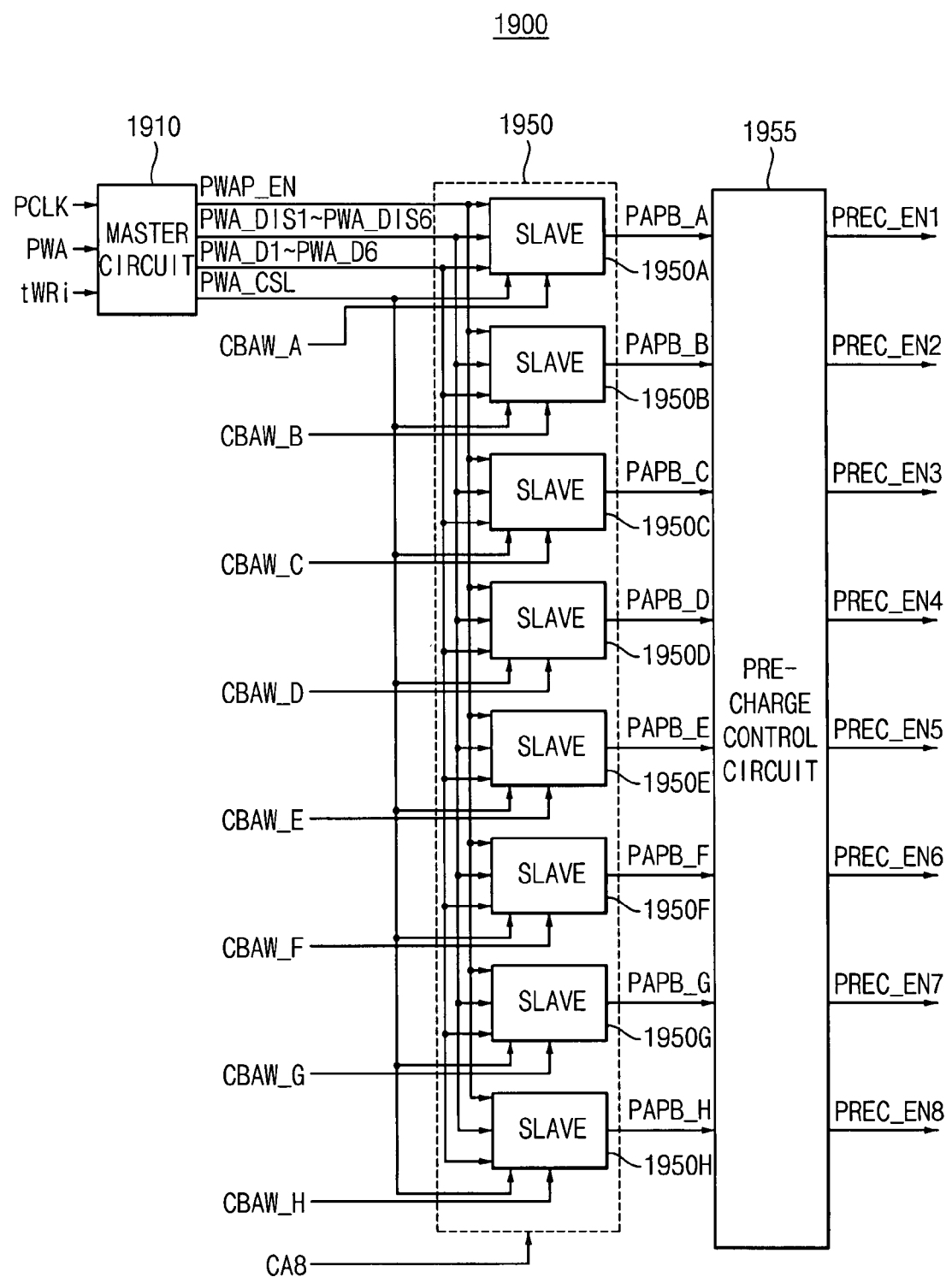
FIG. 11 is a block diagram illustrating a write recovery time control circuit in the semiconductor memory device of FIG. 1 according to at least one example embodiment.

FIG. 11 is a block diagram illustrating a write recovery time control circuit in the semiconductor memory device of FIG. 1 according to at least one example embodiment. The write recovery time control circuit 1900 as illustrated in FIG. 11 may be included in the semiconductor memory device formed with eight memory banks A, B, C, D, E, F, G and H.

Referring to FIG. 11, the write recovery time control circuit 1900 may include a master circuit 1910, a slave circuit 1950 and a pre-charge control circuit 1955.

The master circuit 1910 may generate a first gate control signal PWA_CSL, a second gate control signal which may have bits PWA_D1 through PWA_D6, a third gate control signal PWA_DIS1 through PWA_DIS6 and a fourth gate control signal PWAP_EN, based on the internal clock signal PCLK, the write command signal PWA and the write recovery time control signal tWRi.

The slave circuit 1950 may gate each of bank pre-charge control signals PWAPT_A through PWAPT_H in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN; and may generate a plurality of gated bank pre-charge control signals PAPB_A through PAPB_H.

As illustrated in FIG. 8, the pre-charge control signal generation circuit 1760 may perform an AND operation on the bank address signals CBAW_A through CBAW_H and the auto pre-charge address signal CA8, and may generate the bank pre-charge control signals PWAPT_A through PWAPT_H.

The slave circuit 1950 may include a first slave unit 1950A, a second slave unit 1950B, a third slave unit 1950C, a fourth slave unit 1950D, a fifth slave unit 1950E, a sixth slave unit 1950F, a seventh slave unit 1950G and an eighth slave unit 1950H.

Referring to FIGS. 8 and 11, the first slave unit 1950A may gate a bank pre-charge control signal PWAPT_A for a bank A in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN, and may generate a gated bank pre-charge control signal PAPB_A for the bank A. The second slave unit 1950B may gate a bank pre-charge control signal PWAPT_B for a bank B in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN; and may generate a gated bank pre-charge control signal PAPB_B for the bank B. The third slave unit 1950C may gate a bank pre-charge control signal PWAPT_C for a bank C in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN, and may generate a gated bank pre-charge control signal PAPB_C for the bank C. The fourth slave unit 1950D may gate a bank pre-charge control signal PWAPT_D for a bank D in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN; and may generate a gated bank pre-charge control signal PAPB_D for the bank D. The fifth slave unit 1950E may gate a bank pre-charge control signal PWAPT_E for a bank E in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN; and may generate a gated bank pre-charge control signal PAPB_E for the bank E. The sixth slave unit 1950F may gate a bank pre-charge control signal PWAPT_F for a bank F in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN; and may generate a gated bank pre-charge control signal PAPB_F for the bank F. The seventh slave unit 1950G may gate a bank pre-charge control signal PWAPT_G for a bank G in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN, and may generate a gated bank pre-charge control signal PAPB_G for the bank G. The eighth slave unit 1950H may gate a bank pre-charge control signal PWAPT_H for a bank H in a wave pipeline mode in response to the first gate control signal PWA_CSL, the second gate control signal PWA_D1 through PWA_D6, the third gate control signal PWA_DIS1 through PWA_DIS6 and the fourth gate control signal PWAP_EN, and may generate a gated bank pre-charge control signal PAPB_H for the bank H.

The pre-charge control circuit 1955 may include a plurality of pre-charge control units (not shown) respectively operating for the memory banks A through H; may generate pre-charge enable signals PREC_EN1 through PREC_EN6 in response to the gated bank pre-charge control signals PAPB_A, PAPB_B, PAPB_C, PAPB_D, PAPB_E, PAPB_F, PAPB_G and PAPB_H; and may provide the pre-charge enable signals PREC_EN1 through PREC_EN6 to the row address buffer 1850.

The write recovery time control circuit 1900 may control a generation time point of the gated bank pre-charge control signals PAPB_A, PAPB_B, PAPB_C, PAPB_D, PAPB_E, PAPB_F, PAPB_G and PAPB_H in response to the write recovery time control signal tWRi (i is a natural number). That is, the write recovery time control circuit 1900 may control an activation time point of gated bank pre-charge control signals PAPB_A, PAPB_B, PAPB_C, PAPB_D, PAPB_E, PAPB_F, PAPB_G and PAPB_H for pre-charging the memory banks A through H by delaying the bank pre-charge control signals PWAPT_A through PWAPT_H by clock cycles with reference to an activation time point of the write command signal PWA, where the clock cycles may be determined based on the write recovery time control signal tWRi.

Figure 12:
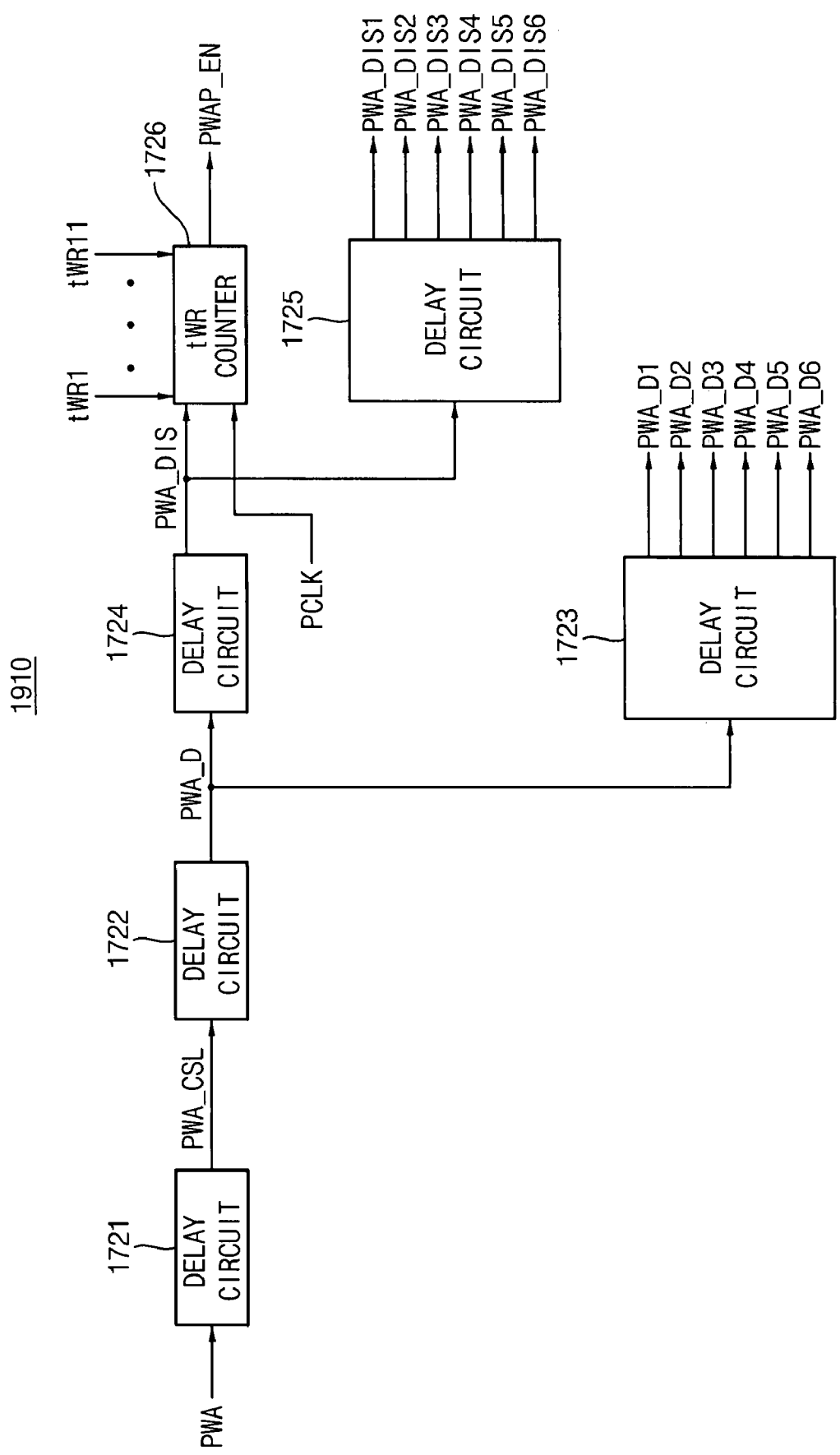
FIG. 12 is a block diagram illustrating a master circuit in the write recovery time control circuit of FIG. 11 according to at least one example embodiment.

FIG. 12 is a block diagram illustrating a master circuit in the write recovery time control circuit of FIG. 11 according to at least one example embodiment.

Referring to FIG. 12, the master circuit 1910 includes a first delay circuit 1721, a second delay circuit 1722, a third delay circuit 1723, a fourth delay circuit 1724, a fifth delay circuit 1725 and a write recovery time counter 1726.

The first delay circuit 1721 may generate the first gate control signal PWA_CSL by delaying the write command signal PWA by a first time. The second delay circuit 1722 may generate a first signal PWA_D by delaying the first gate control signal PWA_CSL by a second time. The third delay circuit 1723 may generate the second gate control signal PWA_D1 through PWA_D6 in response to the first signal PWA_D. The second gate control signal PWA_D1 through PWA_D6 may have a phase difference which may correspond to a period of the first signal PWA_D and may have a plurality of bits. The fourth delay circuit 1724 may generate a second signal PWA_DIS by delaying the first signal PWA_D by a third time. The fifth delay circuit 1725 may generate the third gate control signal PWA_DIS1 through PWA_DIS6 in response to the second signal PWA_DIS. The third gate control signals PWA_DIS1 through PWA_DIS6 may have a phase difference which may correspond to a period of the second signal PWA_DIS and may have a plurality of bits. The write recovery time counter 1726 may generate the fourth gate control signal PWAP_EN by delaying the second signal PWA_DIS by a fourth time in response to the internal clock signal PCLK and the write recovery time control signal tWR1 through tWR11.

For example, the first delay circuit 1721 may generate the first gate control signal PWA_CSL by delaying the write command signal PWA by 2 tCK. The second delay circuit 1722 may generate the first signal PWA_D by delaying the first gate control signal PWA_CSL by 1 tCK. The fourth delay circuit 1724 may generate the second signal PWA_DIS by delaying the first signal PWA_D by 1 tCK.

The fifth delay circuit 1725 may be equally formed as the second delay circuit 1715 of FIG. 3, and the write recovery time counter 1726 may be equally formed as the write recovery time counter 1713 of FIG. 3.

Figure 13:
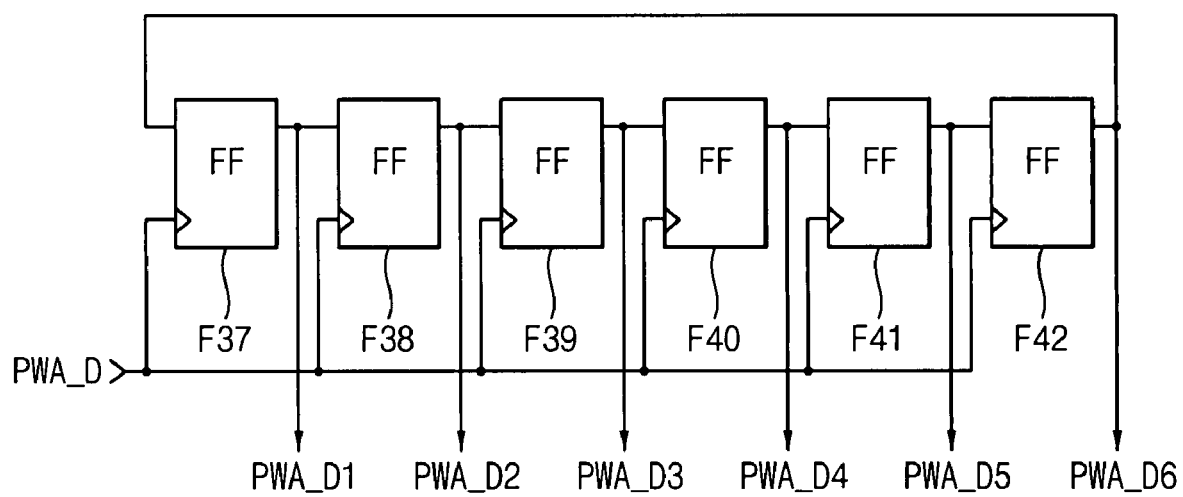
FIG. 13 is a circuit diagram illustrating a third delay circuit in the master circuit of FIG. 11 according to at least one example embodiment.

FIG. 13 is a circuit diagram illustrating a third delay circuit in the master circuit of FIG. 11 according to at least one example embodiment.

The third delay circuit 1723 may include a first flip-flop F37, a second flip-flop F38, a third flip-flop F39, a fourth flip-flop F40, a fifth flip-flop F41 and a sixth flip-flop F42.

The first flip-flop F37 may latch a signal of an input terminal in response to the first signal PWA_D and may generate a first bit of the second gate control signal PWA_D1. The second flip-flop F38 may latch the first bit PWA_D1 of the second gate control signal in response to the first signal PWA_D and may generate a second bit PWA_D2 of the second gate control signal. The third flip-flop F39 may latch the second bit PWA_D2 of the second gate control signal in response to the first signal PWA_D and may generate a third bit PWA_D3 of the second gate control signal. The fourth flip-flop F40 may latch the third bit PWA_D3 of the second gate control signal in response to the first signal PWA_D and may generate a fourth bit PWA_D4 of the second gate control signal. The fifth flip-flop F41 may latch the fourth bit PWA_D4 of the second gate control signal in response to the first signal PWA_D and may generate a fifth bit PWA_D5 of the second gate control signal. The sixth flip-flop F42 may latch the fifth bit PWA_D5 of the second gate control signal in response to the first signal PWA_D and may generate a sixth bit PWA_D6 of the second gate control signal. The input terminal of the first flip-flop F37 may be electrically connected to an output terminal of the sixth flip-flop F42.

Figure 14:
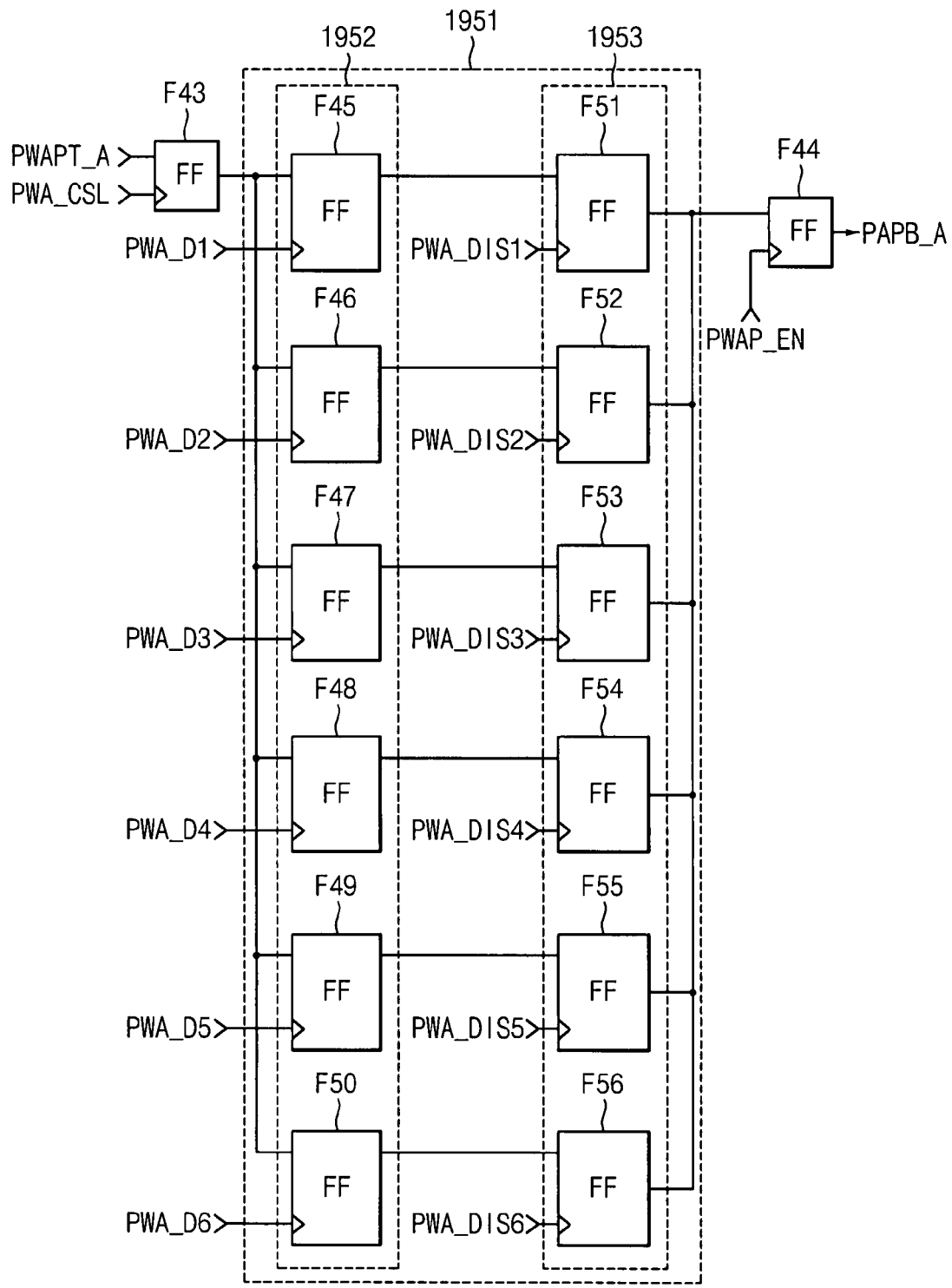
FIG. 14 is a circuit diagram illustrating a first slave unit in the slave circuit of FIG. 11 according to at least one example embodiment.

FIG. 14 is a circuit diagram illustrating a first slave unit in the slave circuit of FIG. 11 according to at least one example embodiment.

Referring to FIG. 14, the first slave unit 1950A may include a first gating circuit F43, a second gating circuit 1952, a third gating circuit 1953 and a fourth gating circuit F44. The second gating circuit 1952 and the third gating circuit 1953 may form a parallel gating circuit 1951.

The first gating circuit F43 may include a first flip-flop F43, may latch the first bank pre-charge control signal PWAPT_A in response to the first gate control signal PWA_CSL and may generate a third signal.

The second gating circuit 1952 may include a second flip-flop F45, a third flip-flop F46, a fourth flip-flop F47, a fifth flip-flop F48, a sixth flip-flop F49 and a seventh flip-flop F50; may latch the third signal in response to the second gate control signal which may have bits PWA_D1 through PWA_D6; and may generate the fourth signal having a plurality of bits.

The second flip-flop F45 may latch the third signal in response to the first bit PWA_D1 of the second gate control signal and may generate a first bit of the fourth signal. The third flip-flop F46 may latch the third signal in response to the second bit PWA_D2 of the second gate control signal and may generate a second bit of the fourth signal. The fourth flip-flop F47 may latch the third signal in response to the third bit PWA_D3 of the second gate control signal and may generate a third bit of the fourth signal. The fifth flip-flop F48 may latch the third signal in response to the fourth bit PWA_D4 of the second gate control signal and may generate a fourth bit of the fourth signal. The sixth flip-flop F49 may latch the third signal in response to the fifth bit PWA_D5 of the second gate control signal and may generate a fifth bit of the fourth signal. The seventh flip-flop F50 may latch the third signal in response to the sixth bit PWA_D6 of the second gate control signal and may generate a sixth bit of the fourth signal.

The third gating circuit 1953 may include an eighth flip-flop F51, a ninth flip-flop F52, a tenth flip-flop F53, an eleventh flip-flop F54, a twelfth flip-flop F55 and a thirteenth flip-flop F56, and may latch the fourth signal in response to the third gate control signal having a plurality of bits and may generate a fifth signal.

The eighth flip-flop F51 may latch the first bit of the fourth signal in response to a first bit PWA_DIS1 of the third gate control signal and may generate the fifth signal. The ninth flip-flop F52 may latch the second bit of the fourth signal in response to a second bit PWA_DIS2 of the third gate control signal and may generate the fifth signal. The tenth flip-flop F53 may latch the third bit of the fourth signal in response to a third bit PWA_DIS3 of the third gate control signal and may generate the fifth signal. The eleventh flip-flop F54 may latch the fourth bit of the fourth signal in response to a fourth bit PWA_DIS4 of the third gate control signal and may generate the fifth signal. The twelfth flip-flop F55 may latch the fifth bit of the fourth signal in response to a fifth bit PWA_DIS5 of the third gate control signal and may generate the fifth signal. The thirteenth flip-flop F56 may latch the sixth bit of the fourth signal in response to a sixth bit PWA_DIS6 of the third gate control signal and may generate the fifth signal. Output terminals of the flip-flops F51 through F56 may be electrically connected to each other.

The fourth gating circuit F44 may include a fourteenth flip-flop F44, may latch the fifth signal in response to the fourth gate control signal PWAP_EN and may generate a first gated bank pre-charge control signal PAPB_A.

The write recovery time control circuit 1900 illustrated in FIG. 11 through FIG. 14 may gate the bank pre-charge control signals PWAPT_A through PWAPT_H in a wave pipeline mode, based on the internal clock signal PCLK, the write command signal PWA, and the write recovery time control signal tWRi; may generate the gated bank pre-charge control signals; and may generate the pre-charge enable signal PRE- C_EN which may correspond to the bank pre-charge control signals PWAPT_A through PWAPT_H. The write recovery time control circuit 1900 of FIG. 11 may gate the bank pre-charge control signals in a wave pipeline mode using the first gate control signal PWA_CSL, the second gate control signal PWA_DL through PWA_D6, the third gate control signal PWA_DIS1 through PWA_DIS6 and the fourth gate control signal PWAP_EN. Each of the slave units 1950A through 1950H may include an input terminal formed by the one flip-flop F43 and an output terminal formed by the one flip-flop F44.

Therefore, the bank pre-charge control signals PWAPT_A through PWAPT_H may be serially inputted to the slave units 1950A through 1950H, the bank pre-charge control signals PWAPT_A through PWAPT_H may be processed in parallel, and the bank pre-charge control signals PWAPT_A through PWAPT_H may be serially outputted. Therefore, the write recovery time control circuit illustrated in FIG. 11 may decrease the instability of a set-up time and a hold time of the bank pre-charge control signals PWAPT_A through PWAPT_H which may exist due to a skew between control signals, and may decrease a skew of the gated bank pre-charge control signals PAPB_A through PAPB_H.

Furthermore, a semiconductor memory device including a write recovery time control circuit according to at least one example embodiment may decrease a number of flip-flops required to control a write recovery time.

Figure 15:
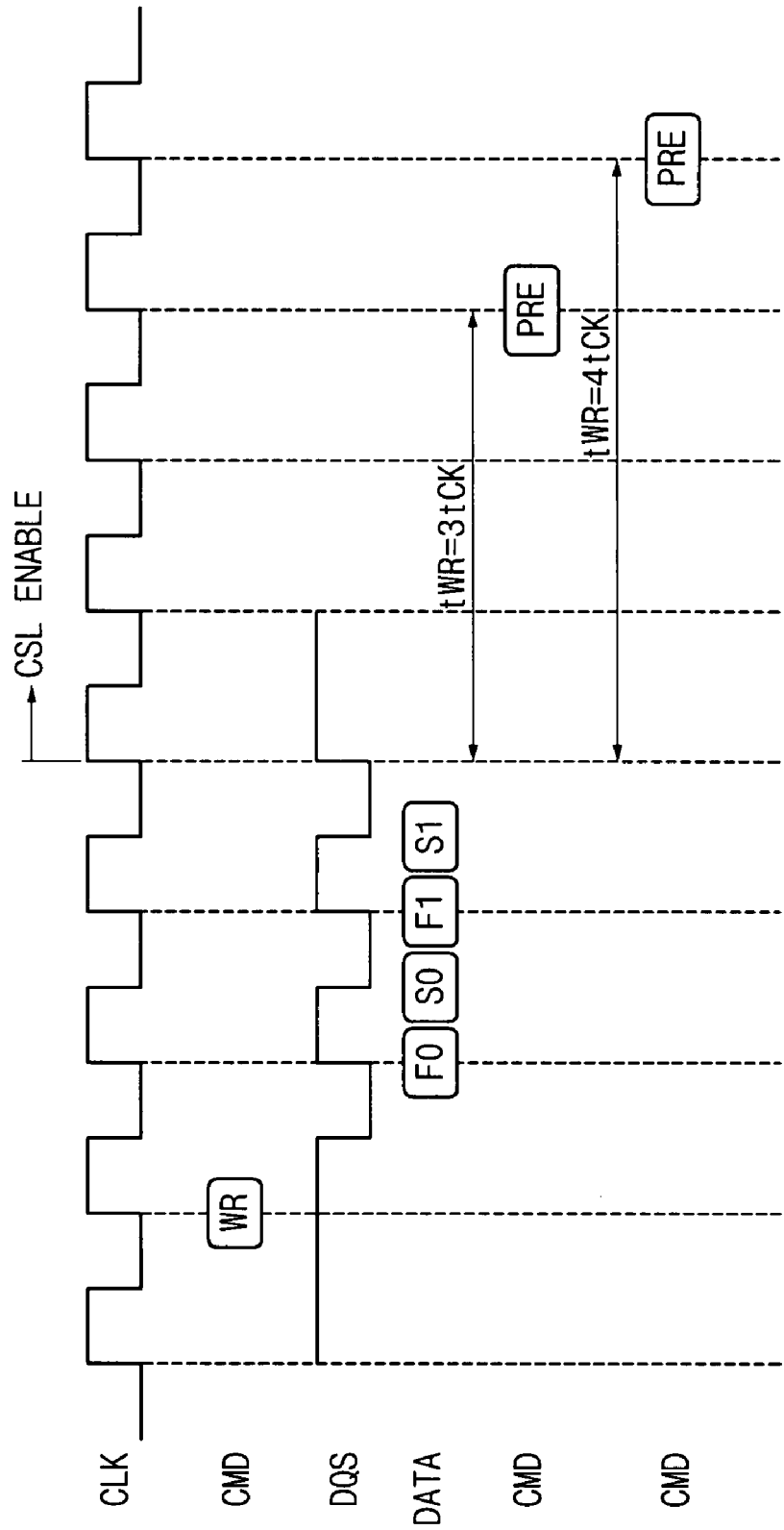
FIG. 15 is a timing diagram illustrating generation time points of a pre-charge command according to a write recovery time.

FIG. 15 is a timing diagram illustrating generation time points of a pre-charge command according to a write recovery time.

Referring to FIG. 15, a data strobe signal DQS is generated synchronized with a clock signal CLK, after a write command is generated data DATA is generated at a rising edge and a falling edge of the data strobe signal DQS. The DATA includes odd-numbered data F0 and F1 and even-numbered data S0 and S1. When a write recovery time tWR is 3 tCK, a pre-charge command PRE is generated at a time point of 3 tCK after a column selection signal CSL is enabled. When a write recovery time tWR is 4 tCK, a pre-charge command PRE is generated at a time point of 4 tCK after a column selection signal CSL is enabled.

Figure 16:
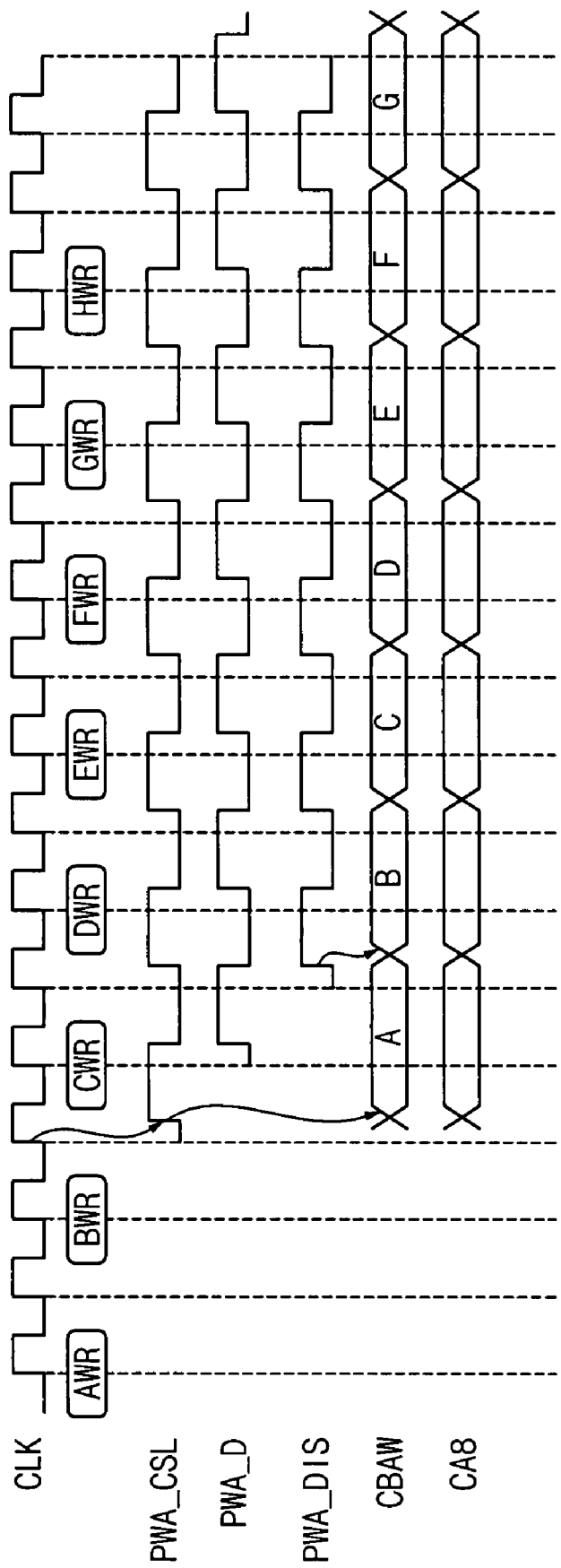
FIG. 16 is a timing diagram illustrating an operation of the write recovery time control circuit of FIG. 11.

FIG. 16 is a timing diagram illustrating an operation of the write recovery time control circuit of FIG. 11.

Referring to FIG. 16, write commands AWR, BWR, CWR, DWR, EWR, FWR, GWR and HWR may be generated per two clock cycles. The first gate control signal PWA_CSL may be generated in response to a clock signal CLK, a first signal PWA_D may be generated later than the first gate control signal PWA_CSL by 1 tCK, the second signal PWA_DIS may be generated later than the first signal PWA_D by 1 tCK. The bank address signals CBAW_A through CBAW_H may be generated synchronized with the first gate control signal PWA_CSL, and the auto pre-charge address signal CA8 may be generated synchronized with the second signal PWA_DIS.

In the above, the write recovery time control circuit used in the semiconductor memory device formed by eight memory banks is illustrated. It will be easily understood, however, the present invention may be applied to a write recovery time control circuit in a semiconductor memory device having an arbitrary number of memory banks.

As described above, a semiconductor memory device including a write recovery time control circuit according to the present invention gates bank pre-charge control signals in a wave pipeline mode and may generate gated bank pre-charge control signals. Therefore, the semiconductor memory device including the write recovery time control circuit may decrease the number of flip-flops required to control a write recovery time and may increase a margin between input control signals and bank pre-charge control signals. The semiconductor memory device including the write recovery time control circuit may decrease power consumption and a size of a semiconductor integrated circuit. The memory device according to the present invention may accurately control a set-up time and a hold time of bank pre-charge control signals, and may decrease a skew of the bank pre-charge control signals.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor memory device, including:
   a clock buffer configured to generate an internal clock signal based on an external clock signal;
   a command decoder configured to generate a write command signal by decoding an external command signal; and
   a write recovery time control circuit configured to gate a plurality of bank pre-charge control signals in a wave pipeline mode based on the internal clock signal, the write command signal and a write recovery time control signal having a plurality of bits to generate a plurality of gated bank pre-charge control signals.

2. The semiconductor memory device of claim 1, wherein the write recovery time control circuit includes:
   a master circuit configured to generate a first gate control signal having a plurality of bits and a second gate control signal having a plurality of bits based on the internal clock signal, the write command signal and the write recovery time control signal; and
   a plurality of slave circuits configured to gate each of the bank pre-charge control signals in a wave pipeline mode in response to the first gate control signal and the second gate control signal to generate the gated bank pre-charge control signals.

3. The semiconductor memory device of claim 2, wherein each of the slave circuits includes:
   a pre-charge control signal generation circuit that performs an AND operation on a bank address signal and an auto pre-charge address signal to generate the bank pre-charge control signal.

4. The semiconductor memory device of claim 2, wherein the master circuit includes:
   a first delay circuit configured to generate a first signal by delaying the write command signal by a first time;
   a write recovery time counter configured to generate a second signal by delaying the first signal by a second time in response to the internal clock signal and the write recovery time control signal;
   a second delay circuit configured to generate the first gate control signal in response to the first signal, the first gate control signal having a phase difference corresponding to a period of the first signal and having a plurality of bits; and
   a third delay circuit configured to generate the second gate control signal in response to the second signal, the second gate control signal having a phase difference corresponding to a period of the second signal and having a plurality of bits.

5. The semiconductor memory device of claim 4, wherein the second time is set based on enabled bits of the write recovery time control signal.

6. The semiconductor memory device of claim 5, wherein the write recovery time counter includes:
   a plurality of flip-flops operated in response to the write recovery time control signal.

7. The semiconductor memory device of claim 4, wherein the second delay circuit includes:
   a first flip-flop configured to latch a signal of an input terminal in response to the first signal to generate a first bit of the first gate control signal;
   a second flip-flop configured to latch the first bit of the first gate control signal in response to the first signal to generate a second bit of the first gate control signal;
   a third flip-flop configured to latch the second bit of the first gate control signal in response to the first signal to generate a third bit of the first gate control signal;
   a fourth flip-flop configured to latch the third bit of the first gate control signal in response to the first signal to generate a fourth bit of the first gate control signal;
   a fifth flip-flop configured to latch the fourth bit of the first gate control signal in response to the first signal to generate a fifth bit of the first gate control signal; and
   a sixth flip-flop configured to latch the fifth bit of the first gate control signal in response to the first signal to generate a sixth bit of the first gate control signal,
   wherein the input terminal of the first flip-flop is electrically connected to an output terminal of the sixth flip-flop.

8. The semiconductor memory device of claim 4, wherein the third delay circuit includes:
   a first flip-flop configured to latch a signal of an input terminal in response to the second signal to generate a first bit of the second gate control signal;
   a second flip-flop configured to latch the first bit of the second gate control signal in response to the second signal to generate a second bit of the second gate control signal;
   a third flip-flop configured to latch the second bit of the second gate control signal in response to the second signal to generate a third bit of the second gate control signal;
   a fourth flip-flop configured to latch the third bit of the second gate control signal in response to the second signal to generate a fourth bit of the second gate control signal;
   a fifth flip-flop configured to latch the fourth bit of the second gate control signal in response to the second signal to generate a fifth bit of the second gate control signal; and
   a sixth flip-flop configured to latch the fifth bit of the second gate control signal in response to the second signal to generate a sixth bit of the second gate control signal,
   wherein the input terminal of the first flip-flop is electrically connected to an output terminal of the sixth flip-flop.

9. The semiconductor memory device of claim 2, wherein the master circuit includes:
   a first delay circuit configured to generate a first signal by delaying the write command signal by a first time;
   a second delay circuit configured to generate a second signal by delaying the first signal by a second time;
   a third delay circuit configured to generate the first gate control signal in response to the first signal, the first gate control signal having a phase difference corresponding to a period of the first signal and having a plurality of bits; and
   a fourth delay circuit configured to generate the second gate control signal in response to the second signal, the second gate control signal having a phase difference corresponding to a period of the second signal and having a plurality of bits.

10. The semiconductor memory device of claim 2, wherein a number of the slave circuits corresponds to a number of memory banks.

11. The semiconductor memory device of claim 10, wherein each of the slave circuits includes:
   a first gating circuit configured to latch a first bank pre-charge control signal in response to the first gate control signal to generate a third signal; and
   a second gating circuit configured to latch the third signal in response to the second gate control signal to generate a first gated bank pre-charge control signal.

12. The semiconductor memory device of claim 11, wherein the first gating circuit includes:
   a first flip-flop configured to latch the first bank pre-charge control signal in response to a first bit of the first gate control signal to generate a first bit of the third signal;
   a second flip-flop configured to latch the first bank pre-charge control signal in response to a second bit of the first gate control signal to generate a second bit of the third signal;
   a third flip-flop configured to latch the first bank pre-charge control signal in response to a third bit of the first gate control signal to generate a third bit of the third signal;
   a fourth flip-flop configured to latch the first bank pre-charge control signal in response to a fourth bit of the first gate control signal to generate a fourth bit of the third signal;
   a fifth flip-flop configured to latch the first bank pre-charge control signal in response to a fifth bit of the first gate control signal to generate a fifth bit of the third signal; and
   a sixth flip-flop configured to latch the first bank pre-charge control signal in response to a sixth bit of the first gate control signal to generate a sixth bit of the third signal.

13. The semiconductor memory device of claim 12, wherein the second gating circuit includes:
   a first latch configured to latch the first bit of the third signal in response to a first bit of the second gate control signal to generate the first gated bank pre-charge control signal;
   a second latch configured to latch the second bit of the third signal in response to a second bit of the second gate control signal to generate the first gated bank pre-charge control signal;
   a third latch configured to latch the third bit of the third signal in response to a third bit of the second gate control signal to generate the first gated bank pre-charge control signal;
   a fourth latch configured to latch the fourth bit of the third signal in response to a fourth bit of the second gate control signal to generate the first gated bank pre-charge control signal;
   a fifth latch configured to latch the fifth bit of the third signal in response to a fifth bit of the second gate control signal to generate the first gated bank pre-charge control signal; and
   a sixth latch configured to latch the sixth bit of the third signal in response to a sixth bit of the second gate control signal to generate the first gated bank pre-charge control signal.

14. The semiconductor memory device of claim 2, wherein the write recovery time control circuit further includes:
a pre-charge control circuit configured to generate a plurality of pre-charge enable signals in response to the gated bank pre-charge control signals to provide the pre-charge enable signals to a row address buffer.

15. The semiconductor memory device of claim 1, wherein the write recovery time control circuit includes:
a master circuit configured to generate a first gate control signal, a second gate control signal having a plurality of bits, a third gate control signal having a plurality of bits and a fourth gate control signal; and
a plurality of slave circuits configured to gate each of the bank pre-charge control signals in a wave pipeline mode in response to the first gate control signal, the second gate control signal, the third gate control signal and the fourth gate control signal to generate the gated bank pre-charge control signals.

16. The semiconductor memory device of claim 15, wherein the master circuit includes:
a first delay circuit configured to generate the first gate control signal by delaying the write command signal by a first time;
a second delay circuit configured to generate a first signal by delaying the first gate control signal by a second time;
a third delay circuit configured to generate the second gate control signal in response to the first signal, the second gate control signal having a phase difference corresponding to a period of the first signal and having a plurality of bits;
a fourth delay circuit configured to generate a second signal by delaying the first signal by a third time;
a fifth delay circuit configured to generate the third gate control signal in response to the second signal, the third gate control signal having a phase difference corresponding to a period of the second signal and having a plurality of bits; and
a write recovery time counter configured to generate the fourth gate control signal by delaying the second signal by a fourth time in response to the internal clock signal and the write recovery time control signal.

17. The semiconductor memory device of claim 16, wherein the first delay circuit generates the first gate control signal by delaying the write command signal by two cycles of the internal clock signal.

18. The semiconductor memory device of claim 16, wherein the fourth time is set based on enabled bits of the write recovery time control signal.

19. The semiconductor memory device of claim 16, wherein the fifth delay circuit includes:
a first flip-flop configured to latch a signal of an input terminal in response to the second signal to generate a first bit of the third gate control signal;
a second flip-flop configured to latch the first bit of the third gate control signal in response to the second signal to generate a second bit of the third gate control signal;
a third flip-flop configured to latch the second bit of the third gate control signal in response to the second signal to generate a third bit of the third gate control signal;
a fourth flip-flop configured to latch the third bit of the third gate control signal in response to the second signal to generate a fourth bit of the third gate control signal;
a fifth flip-flop configured to latch the fourth bit of the third gate control signal in response to the second signal to generate a fifth bit of the third gate control signal; and
a sixth flip-flop configured to latch the fifth bit of the third gate control signal in response to the second signal to generate a sixth bit of the third gate control signal, wherein the input terminal of the first flip-flop is electrically connected to an output terminal of the sixth flip-flop.

20. The semiconductor memory device of claim 15, wherein each of the slave circuits includes:
a first gating circuit configured to latch a first bank pre-charge control signal in response to the first gate control signal to generate a third signal;
a second gating circuit configured to latch the third signal in response to the second gate control signal to generate a fourth signal having a plurality of bits;
a third gating circuit configured to latch the fourth signal in response to the third gate control signal to generate a fifth signal; and
a fourth gating circuit configured to latch the fifth signal in response to the fourth gate control signal to generate a first gated bank pre-charge control signal.

21. The semiconductor memory device of claim 20, wherein the first gating circuit includes:
a flip-flop configured to latch the first bank pre-charge control signal in response to a first bit of the first gate control signal to generate the third signal.

22. The semiconductor memory device of claim 20, wherein the second gating circuit includes:
a first flip-flop configured to latch the third signal in response to a first bit of the second gate control signal to generate a first bit of the fourth signal;
a second flip-flop configured to latch the third signal in response to a second bit of the second gate control signal to generate a second bit of the fourth signal;
a third flip-flop configured to latch the third signal in response to a third bit of the second gate control signal to generate a third bit of the fourth signal;
a fourth flip-flop configured to latch the third signal in response to a fourth bit of the second gate control signal to generate a fourth bit of the fourth signal;
a fifth flip-flop configured to latch the third signal in response to a fifth bit of the second gate control signal to generate a fifth bit of the fourth signal; and
a sixth flip-flop configured to latch the third signal in response to a sixth bit of the second gate control signal to generate a sixth bit of the fourth signal.

23. The semiconductor memory device of claim 20, wherein the third gating circuit includes:
a first flip-flop configured to latch a first bit of the fourth signal in response to a first bit of the third gate control signal to generate the fifth signal;
a second flip-flop configured to latch a second bit of the fourth signal in response to a second bit of the third gate control signal to generate the fifth signal;
a third flip-flop configured to latch a third bit of the fourth signal in response to a third bit of the third gate control signal to generate the fifth signal;
a fourth flip-flop configured to latch a fourth bit of the fourth signal in response to a fourth bit of the third gate control signal to generate the fifth signal;
a fifth flip-flop configured to latch a fifth bit of the fourth signal in response to a fifth bit of the third gate control signal to generate the fifth signal; and
a sixth flip-flop configured to latch a sixth bit of the fourth signal in response to a sixth bit of the third gate control signal to generate the fifth signal.

24. The semiconductor memory device of claim 20, wherein the fourth gating circuit includes a flip-flop configured to latch the fifth signal in response to the fourth gate control signal to generate the first gated bank pre-charge control signal.

25. The semiconductor memory device of claim 1, further including:

an input latency control circuit configured to gate an address signal in a wave pipe line mode to generate a column address signal and a bank address signal based on the internal clock signal, the write command signal and a write latency signal.

* * * * *